(12) United States Patent
Kim et al.

(10) Patent No.: US 11,031,440 B2
(45) Date of Patent: Jun. 8, 2021

(54) LIGHT CONVERSION SUBSTRATE, DISPLAY DEVICE, AND METHOD OF MANUFACTURING DISPLAY DEVICE

(71) Applicant: SAMSUNG DISPLAY CO., LTD., Yongin-si (KR)

(72) Inventors: Jang Il Kim, Asan-si (KR); Jeong Ki Kim, Hwaseong-si (KR); Jong Hoon Kim, Seoul (KR); Jea Heon Ahn, Hwaseong-si (KR); Myoung Jong Lee, Cheonan-si (KR); Seok Joon Hong, Seongnam-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 0 days.

(21) Appl. No.: 16/677,963

(22) Filed: Nov. 8, 2019

(65) Prior Publication Data

US 2020/0266243 A1 Aug. 20, 2020

(30) Foreign Application Priority Data

Feb. 18, 2019 (KR) .................. 10-2019-0018649

(51) Int. Cl.
*H01L 27/32* (2006.01)
*H01L 51/52* (2006.01)
*H01L 51/56* (2006.01)
*H01L 51/00* (2006.01)

(52) U.S. Cl.
CPC ........ *H01L 27/322* (2013.01); *H01L 27/3244* (2013.01); *H01L 51/0018* (2013.01); *H01L 51/5268* (2013.01); *H01L 51/56* (2013.01); H01L 2227/323 (2013.01); H01L 2251/5369 (2013.01)

(58) Field of Classification Search
CPC ... H01L 27/322; H01L 51/56; H01L 27/3244; H01L 51/0018; H01L 51/5268; H01L 2251/5369; H01L 2227/323; H01L 33/50–508; H01L 2933/0041
See application file for complete search history.

(56) References Cited

U.S. PATENT DOCUMENTS

2019/0018286 A1* 1/2019 Kim .................. G02F 1/133504
2019/0325791 A1* 10/2019 Lin ........................ G02B 5/201
2020/0058888 A1* 2/2020 Sugiyama ............. H01L 51/502

FOREIGN PATENT DOCUMENTS

JP        2009-230889      10/2009
KR   10-2012-0001719      1/2012

* cited by examiner

*Primary Examiner* — Cuong B Nguyen
(74) *Attorney, Agent, or Firm* — F. Chau & Associates, LLC

(57) ABSTRACT

A light conversion substrate includes a first substrate having a first region, a second region, and a third region. A first light conversion pattern is disposed on the first region and includes first wavelength conversion particles. A second light conversion pattern is disposed on the second region and is spaced apart from the first light conversion pattern and includes second wavelength conversion particles. A first scattering pattern is disposed on the third region to fill a space between the first light conversion pattern and the second light conversion pattern and includes first scattering particles. The first scattering pattern overlaps a portion of the first light conversion pattern and a portion of the second light conversion pattern in a direction of the thickness of the first substrate.

16 Claims, 18 Drawing Sheets

LIGHT CONVERSION SUBSTRATE, DISPLAY DEVICE, AND METHOD OF MANUFACTURING DISPLAY DEVICE

This application claims priority under 35 U.S.C. § 119 to Korean Patent Application No. 10-2019-0018649, filed on Feb. 18, 2019 in the Korean Intellectual Property Office, the disclosure of which is incorporated by reference in its entirety herein.

TECHNICAL FIELD

The present disclosure relates to a light conversion substrate, a display device, and a method of manufacturing a display device.

DISCUSSION OF RELATED ART

Display devices have become increasingly important as multimedia technology has advanced. Accordingly, various kinds of display devices such as liquid crystal display (LCD) devices and organic light-emitting diode (OLED) display devices are being developed.

Among the current display devices, the OLED display device includes an organic light-emitting element, which is a self-luminous element. The organic light-emitting element may include two opposite electrodes having an organic light-emitting layer interposed therebetween. Electrons and holes provided from the two electrodes recombine in the light-emitting layer to generate excitons. The generated excitons transition from an excited state to a ground state to emit light.

Since the OLED display device does not require a separate light source, the OLED display device has a relatively low power consumption. Furthermore, the OLED display device is thin and lightweight and provides high image quality characteristics, such as a wide viewing angle, high luminance and contrast, and a fast response speed.

SUMMARY

Exemplary embodiments of the present inventive concepts provide a light conversion substrate that reduces color mixing due to light emitted from a light-emitting element of a pixel traveling to a light conversion pattern of a pixel adjacent thereto, and a display device.

According to an exemplary embodiment of the present disclosure, a light conversion substrate includes a first substrate having a first region, a second region, and a third region. A first light conversion pattern is disposed on the first region and includes first wavelength conversion particles. A second light conversion pattern is disposed on the second region and is spaced apart from the first light conversion pattern and includes second wavelength conversion particles. A first scattering pattern is disposed on the third region to fill a space between the first light conversion pattern and the second light conversion pattern and includes first scattering particles. The first scattering pattern overlaps a portion of the first light conversion pattern and a portion of the second light conversion pattern in a direction of the thickness of the first substrate.

The first scattering pattern may comprise a flat portion, a first overlap portion which extends from one side of the flat portion and overlaps the second light conversion pattern, and a second overlap portion which extends from the other side of the flat portion and overlaps the first light conversion pattern.

Thicknesses of the first overlap portion and the second overlap portion may be greater than a thickness of the flat portion.

The light conversion substrate may further comprise a capping layer which is disposed on the first light conversion pattern and the second light conversion pattern and is disposed between the first substrate and the first scattering pattern.

The light conversion substrate may further comprise a second scattering pattern which is disposed between the first region and the second region to fill the space between the first light conversion pattern and the second light conversion pattern and overlaps a portion of the first light conversion pattern and a portion of the second light conversion pattern.

The first light conversion pattern, the second light conversion pattern, and the first scattering pattern may have a stripe form which extends in a column direction when viewed from above.

The first scattering pattern and the second scattering pattern may comprise the same scattering particles.

A maximum thickness of the second scattering pattern may be greater than a maximum thickness of the first light conversion pattern and a maximum thickness of the second light conversion pattern.

Each of the first light conversion pattern and the second light conversion pattern may further comprise the same scattering particles as the first scattering pattern.

A size of the first wavelength conversion particles may be greater than a size of the second wavelength conversion particles.

The first region, the second region, and the third region may comprise a plurality of pixels in the column direction and a row direction intersecting with the column direction and comprise a third scattering pattern which is disposed on the first light conversion pattern and the second light conversion pattern along a row boundary between the pixels and is disposed between a first overlap portion and the second scattering pattern and between a second overlap portion and the second scattering pattern.

A thickness of the first overlap portion, a thickness of the second overlap portion, a thickness of the second scattering pattern, and a thickness of the third scattering pattern may be the same.

According to an exemplary embodiment of the present inventive concepts, a display device includes a light-conversion substrate and a light-providing substrate that face each other. The light-conversion substrate and light-providing substrate include a first pixel region and a second pixel region. The light conversion substrate includes a first substrate. A first light conversion pattern is disposed in the first pixel region and includes first wavelength conversion particles. A second light conversion pattern is disposed in the second pixel region and is spaced apart from the first light conversion pattern. The second light conversion pattern includes second wavelength conversion particles. A first scattering pattern is disposed to fill a space between the first light conversion pattern and the second light conversion pattern. The first scattering pattern includes scattering particles. The light-providing substrate comprises a first emission region overlapping the first light conversion pattern, a second emission region overlapping the second light conversion pattern, and a third emission region overlapping the first scattering pattern. The first scattering pattern overlaps a portion of the first light conversion pattern and a portion of the second light conversion pattern in a direction of a thickness of the first substrate.

The display device may further comprise a second scattering pattern which is disposed between the first pixel region and the second pixel region to fill the space between the first light conversion pattern and the second light conversion pattern and overlaps a portion of the first light conversion pattern and a portion of the second light conversion pattern.

The first scattering pattern and the second scattering pattern may comprise the same scattering particles.

The first emission region, the second emission region, and the third emission region may emit first color light, the first light conversion pattern may convert the first color light into second color light to output the second color light, and the second light conversion pattern may convert the first color light into third color light to output the third color light.

The display device may further comprise a filler which is disposed between the light conversion substrate and the light-providing substrate.

Exemplary embodiments of the present inventive concepts also provide a manufacturing method capable of reducing the number of masks and process operations using a semi-transparent mask (halftone mask or slit mask).

According to an exemplary embodiment of the present inventive concepts, a method of manufacturing a display device includes forming a first light conversion pattern on a first substrate, the first light conversion pattern including first wavelength conversion particles. A second light conversion pattern is formed on the first substrate. The second light conversion pattern is spaced apart from the first light conversion pattern and includes second wavelength conversion particles. A first scattering pattern and a second scattering pattern are concurrently formed on regions of the first substrate that are not covered by the first light conversion pattern and the second light conversion pattern. The first scattering pattern and second scattering pattern overlap portions of the first light conversion pattern and second light conversion pattern in a direction of a thickness of the first substrate.

The method may further comprise prior to the forming of the first light conversion pattern, forming a first capping layer on the first substrate, and forming a second capping layer on the first light conversion pattern and the second light conversion pattern.

The concurrently forming of the first scattering pattern and the second scattering pattern may comprise applying photoresist on the first substrate, the first light conversion pattern, and the second light conversion pattern, disposing a mask on the photoresist, wherein the mask comprises a light blocking portion which overlaps the first light conversion pattern and the second light conversion pattern, a light transmitting portion which overlaps the first scattering pattern covering the first substrate exposed without being covered by the first light conversion pattern and the second light conversion pattern, and a semi-transmitting portion which overlaps the first scattering pattern and the second scattering pattern transmitting portion covering a portion of the first light conversion pattern, exposing the photoresist through the mask, and developing the photoresist.

It should be noted that objects of the present invention are not limited to the above-described objects, and other objects of the present invention will be apparent to those skilled in the art from the following descriptions.

BRIEF DESCRIPTION OF THE DRAWINGS

The above and other aspects and features of the present disclosure will become more apparent by describing exemplary embodiments thereof in detail with reference to the attached drawings, in which.

DETAILED DESCRIPTION OF THE EXEMPLARY EMBODIMENTS

Figure 1:
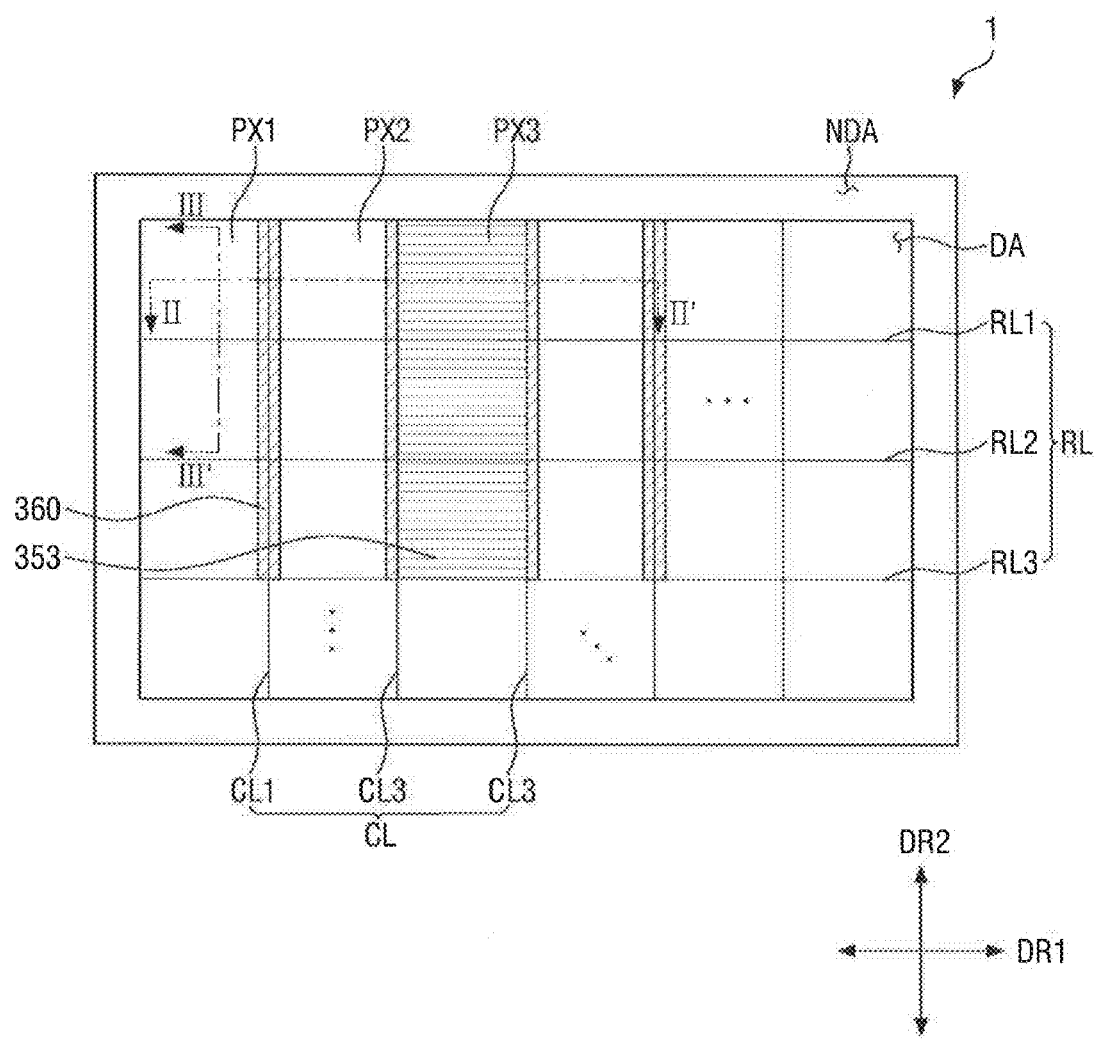
FIG. 1 is a plan view illustrating an arrangement of pixels, a first scattering pattern, and a second scattering pattern of a display device in accordance with an exemplary embodiment of the present inventive concepts.

The advantages and features of the invention and methods for achieving the advantages and features will be apparent by referring to the exemplary embodiments to be described in detail with reference to the accompanying drawings. However, the invention is not limited to the exemplary embodiments disclosed hereinafter, but may be implemented in diverse forms. The specific elements of the exemplary embodiments discussed in the description, including the detailed construction and elements, are solely to assist those of ordinary skill in the art in a comprehensive understanding of the present inventive concepts. However, the scope of the invention is not limited thereby.

Where an element is described as being related to another element such as being "on" another element or "located on" a different layer or a layer, these elements include both an embodiment where an element is located directly on another element or a layer and an embodiment where an element is located on another element via another layer or still another element. In contrast, where an element is described as being related to another element such as being "directly on" another element or "located directly on" a different layer or a layer, this indicates an embodiment where an element is located on another element or a layer with no intervening element or layer therebetween. In the entire description of the invention, the same drawing reference numerals are used for the same elements across various figures.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section but the exemplary embodiments of the present inventive concepts are not limited thereby. For example, a first element, component, region, layer or section described below could be termed a second element, component, region, layer or section, without departing from the spirit and scope of the present invention. The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (e.g., meaning "including, but not limited to,") unless otherwise noted.

Hereinafter, exemplary embodiments of the present inventive concepts will be described with reference to the attached drawings.

Figure 2:
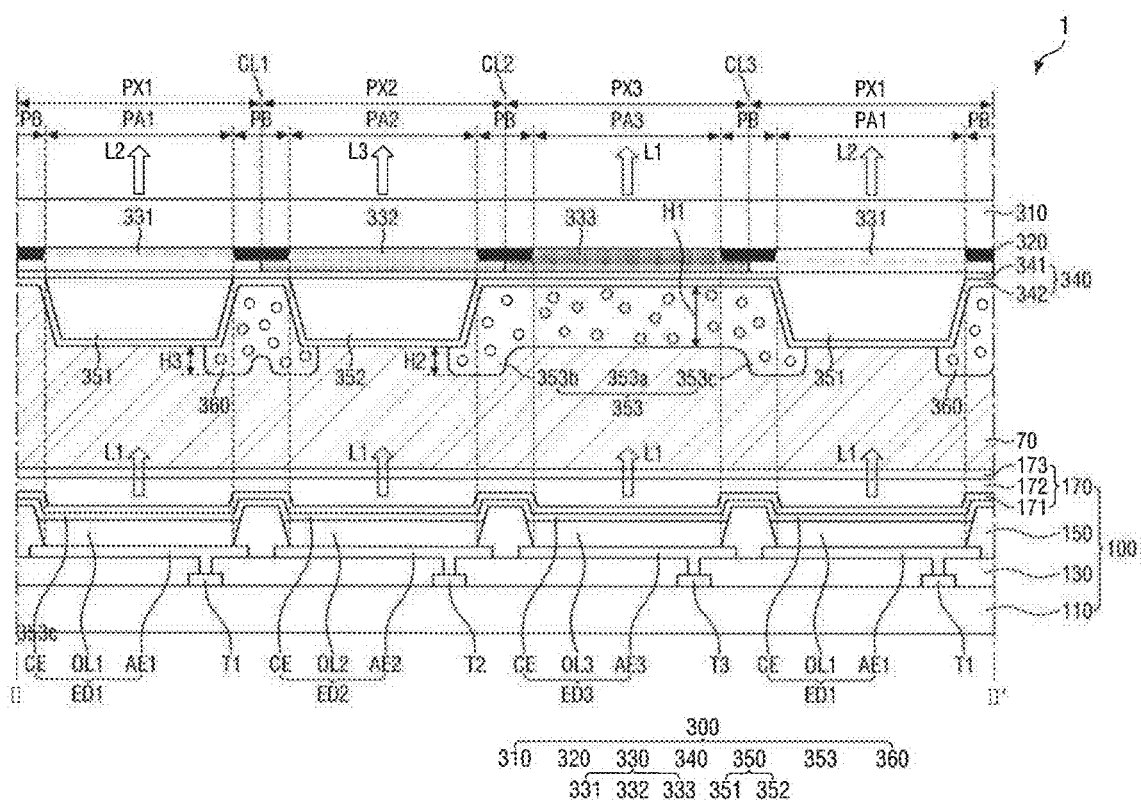
FIG. 2 is a cross-sectional view of a display device which is taken along line II-II' of FIG. 1 according to an exemplary embodiment of the present inventive concepts.
Figure 3:
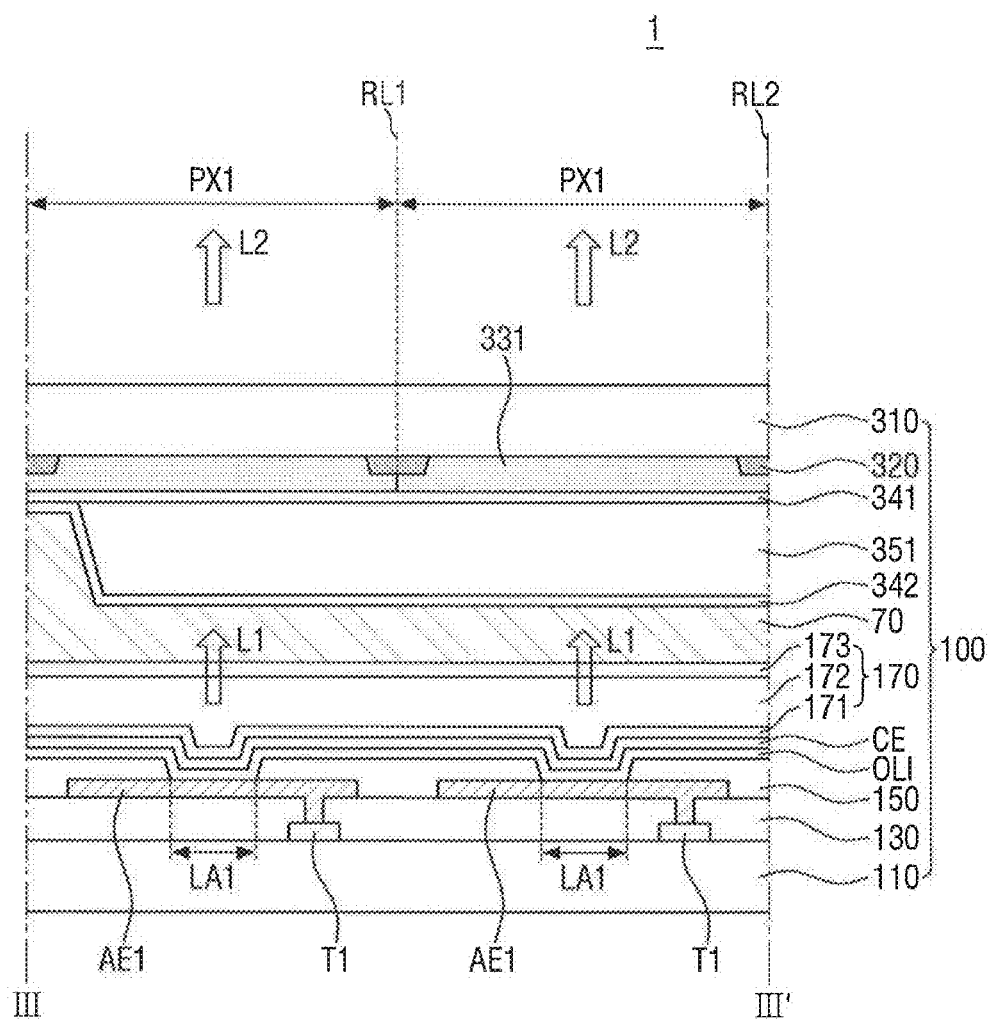
FIG. 3 is a cross-sectional view of the display device which is taken along line III-III' of FIG. 1 according to an exemplary embodiment of the present inventive concepts.
Figure 4:
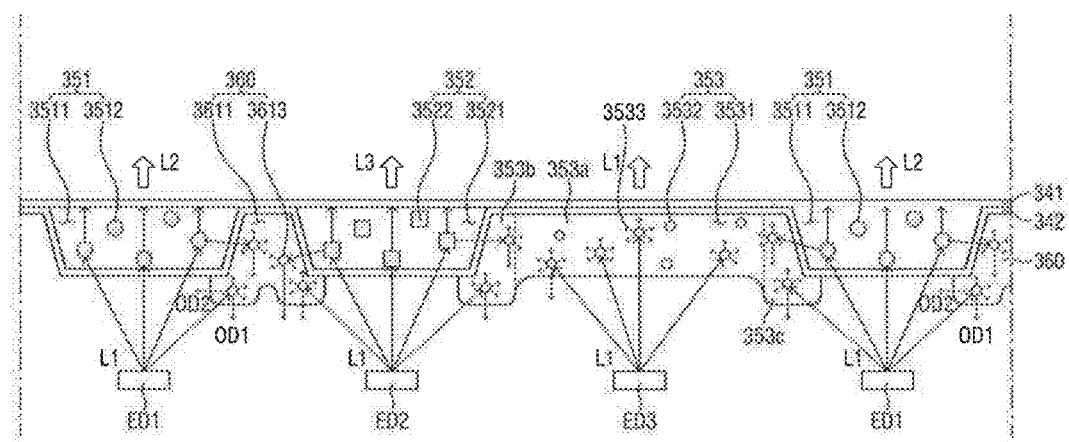
FIG. 4 is a cross-sectional view illustrating a path of light passing through a first scattering pattern and a second scattering pattern according to an exemplary embodiment of the present inventive concepts.

FIG. 1 is a plan view illustrating an arrangement of pixels, a first scattering pattern, and a second scattering pattern of a display device in accordance with an exemplary embodiment of the present inventive concepts. FIG. 2 is a cross-sectional view of a display device which is taken along line II-II' of FIG. 1 according to an exemplary embodiment of the present inventive concepts. FIG. 3 is a cross-sectional view of the display device which is taken along line of FIG. 1 according to an exemplary embodiment of the present inventive concepts. FIG. 4 is a cross-sectional view illustrating a path of light passing through the first scattering pattern and the second scattering pattern according to an exemplary embodiment of the present inventive concepts. Referring to FIGS. 1 to 4, the display device 1 may include an organic light-emitting diode display device, a liquid crystal display device, a quantum nano light-emitting display device, a micro light-emitting diode (LED) device, a field emission display device, an electrophoresis device, etc. However, in the exemplary embodiment shown in FIGS. 1-4, the display device is an organic light-emitting diode display device.

As shown in FIG. 1, the display device 1 may include a display region DA in which an image is displayed and a non-display region NDA in which an image is not displayed.

The display region DA may be disposed at a center of the display device 1. The display region DA may include a plurality of pixels. The plurality of pixels may be disposed in a matrix form. The plurality of pixels may include a plurality of first pixels PX1 for displaying a first color, a plurality of second pixels PX2 for displaying a second color, and a plurality of third pixels PX3 for displaying a third color. In an exemplary embodiment, the first pixels PSS 1 may be red pixels which emit red light having a peak wavelength of about 610 ran to about 650 nm. The second pixels PX2 may be green pixels which emit green light having a peak wavelength of about 510 nm to about 550 nm. The third pixels PX3 may be blue pixels which emit blue light having a peak wavelength of about 430 nm to about 470 nm. However, the exemplary embodiments of the present inventive concepts are not limited thereto.

The first pixels PX1, the second pixels PX2, and the third pixels PX3 may be disposed in the display region DA in a stripe form. All pixels belonging to the same pixel column may display the same color. For example, the plurality of first pixels PX1 may be disposed in a first pixel column, the plurality of second pixels PX2 may be disposed in a second pixel column, and the plurality of third pixels PX3 may be disposed in a third pixel column, and such an arrangement may be repeated in a row direction.

As shown in FIGS. 2-3, a light blocking pattern 320 may be disposed at a boundary between the different plurality of pixels PX1, PX2, PX3. The light blocking pattern 320 may be disposed between color filters 331, 332, and 333. A first scattering pattern 353 and a second scattering pattern 360 may be disposed along pixel row boundaries RL1, RL2, and RL3 and pixel column boundaries CL1, CL2, and CL3. The first scattering pattern 353 and the second scattering pattern 360 will be described in detail below.

Hereinafter, a cross-sectional structure of the display device 1 will be described in more detail with reference to FIGS. 2 to 4.

As shown in the exemplary embodiments of FIGS. 2 to 4, the display device 1 may include a light-providing substrate 100, a light conversion substrate 300, and a filler 70.

The light-providing substrate 100 may include a first base substrate 110, switching elements T1, T2, and T3, an insulating film 130, a bank layer 150, organic light-emitting elements ED1, ED2, and ED3, and a thin film encapsulation layer 170.

The first base substrate 110 may be made of a material having a light-transmitting property. For example, the first base substrate 110 may be an organic substrate or a plastic substrate.

At least one switching element T1, at least one switching element T2, and at least one switching element T3 may be disposed on the first base substrate 110 in pixels PX1, PX2, or PX3. Furthermore, a plurality of signal lines for transmitting signals to the switching elements T1, T2, and T3 may be further disposed on the first base substrate 110. For example, gate lines, data lines, and power lines for transmitting signals to the switching elements T1, T2, T3 may be disposed on the first substrate 110.

An insulating film 130 may be disposed on the switching elements T1, T2, and T3. The insulating film 130 may be formed as an organic layer. For example, the insulating film 130 may include an acrylic-based resin, an epoxy-based resin, an imide-based resin, an ester-based resin, and the like.

Pixel electrodes AE1, AE2, and AE3 may, be disposed in the pixels PX1, PX2, and PX3 on the insulating film 130. The pixel electrodes AE1, AE2, and AE3 may be connected to the switching elements T1, T2, and T3 through via holes passing through the insulating film 130.

In an exemplary embodiment, the pixel electrodes AE1, AE2, and AE3 may be anodes of the organic light-emitting elements. The pixel electrodes AE1, AE2, and AE3 may include a material with a high work function, which facilitates an injection of holes such as indium tin oxide (ITO), indium zinc oxide (IZO), zinc oxide (ZnO), or indium oxide ($In_2O_3$). In an embodiment in which the display device is a top emission display device, the pixel electrodes AE1, AE2, and AE3 may further include a reflective material layer.

The bank layer 150 may be disposed on the pixel electrodes AE1, AE2, and AE3. The bank layer 150 may be formed in a lattice shape disposed along the pixel column boundaries CL1 and CL2 and the pixel row boundaries RL1 and RL2. In addition, the bank layer 150 may include openings that partially expose the pixel electrodes AE1, AE2, and AE3. Regions of the pixel electrodes AE1, AE2, and AE3, which are not covered by the bank layer 150 and are exposed may define emission regions PA1, PA2 and PA3. The regions covered by the bank layers 150 may define non-emission regions PB. The bank layer 150 may include an organic insulating material.

Organic layers OL1, OL2, and OL3 may be disposed on the pixel electrodes AE1, AE2 and AE3 in regions exposed by the openings of the bank layer 150. The organic layers are illustrated in the drawing as being integrally connected without distinction between pixels. However, the organic layer may be formed separately for each of the pixels PX1, PX2, and PX3.

The organic layers OL1, OL2, and OL3 include an organic light-emitting layer. In the organic light-emitting layer, electrons and holes provided from an anode and a cathode may recombine to generate excitons, and the generated excitons may transition from an excited state to a ground state to emit blue light L1. The organic layers OL1, OL2, and OL3 may further include an auxiliary layer which assists in injection/movement of holes and electrons.

A common electrode CE may be disposed on the organic layers OL1, OL2, and OL3. When the pixel electrodes AE1, AE2, and AE3 are anodes of the organic light-emitting elements, the common electrode CE may be a cathode and may include a material with a low work function, which facilitates an injection of electrons, such as Li, Ca, LiF/Ca, LiF/Al, Al, Mg, Ag, Pt, Pd, Ni, Au Nd, Ir, Cr, BaF, Ba, or a compound or mixture thereof. For example, in an exemplary embodiment, the common electrode CE may comprise a mixture of Ag and Mg.

The first pixel electrode AE1, the organic layer OL1, and the common electrode CE may constitute a first organic light-emitting element ED1. The second pixel electrode AE2, the organic layer OL2, and the common electrode CE may constitute a second organic light-emitting element ED2. The third pixel electrode AE3, the organic layer OL3, and the common electrode CE may constitute a third organic light-emitting element ED3.

In an exemplary embodiment, the organic light-emitting elements ED1, ED2 and ED3 may emit a blue light. The blue light L1 emitted from each of the organic light-emitting elements ED1, ED2, and ED3 disposed in the pixels PX1, PX2, and PX3 may be provided to a corresponding one of the pixels. Furthermore, light emitted from the organic light-emitting elements ED1, ED2, and ED3 may also be provided to adjacent pixels.

A thin encapsulation layer 170 may be disposed on the common electrode CE. The thin encapsulation layer 170 may be disposed on the organic light-emitting elements ED1, ED2, and ED3 to seal the organic light-emitting elements ED1, ED2, and ED3 for preventing permeation of impurities, moisture, or the like from the outside. The thin encapsulation layer 170 may include a first encapsulating inorganic film 171 and a third encapsulating inorganic film 173, which include an organic material, and an encapsulating organic film 172 disposed therebetween.

Hereinafter, the light conversion substrate 300 will be described below. The light conversion substrate 300 may include a second base substrate 310, the light blocking pattern 320, the color filters 331, 332, and 333, light conversion patterns 351 and 352, a plurality of stacked capping layers 341 and 342, the first scattering pattern 353, and the second scattering pattern 360.

The second base substrate 310 is opposite to the first base substrate 110. The second base substrate 310 may include at least one material selected from the exemplified materials of the first base substrate 110.

The light blocking pattern 320 may be disposed on a surface of the second base substrate 310 that faces the light-providing substrate 100. The light blocking pattern 320 may be formed in a lattice shape disposed along the pixel column boundaries CL1 and CL2 and the pixel row boundaries RL1 and RL2.

The light blocking pattern 320 may block transmission of light. Specifically, the light blocking pattern 320 may be configured to prevent the mixing of light beams emitted to a display surface from the pixels PX1, PX2, and PX3. The light blocking pattern 320 may be formed of at least one material selected from among an opaque organic material, a chromium-containing metal material, and carbon black.

A color filter 330 may be disposed on one surface of the second base substrate 310. For example, the color filter 330 may be disposed on a bottom surface of the second base substrate 310 which faces the first base substrate 110. Furthermore, the color filter 330 may be disposed on the light blocking pattern 320. The color filter 330 may be an absorption-type filter that absorbs light having a specific wavelength and transmits light having other specific wavelengths.

The color filter 330 may include the first, second, and third color filters 331, 332, and 333. The first to third color filters 331 to 333 may be disposed in a stripe form. In an exemplary embodiment, the first to third color filters 331 to 333 may be disposed so as to be integrally connected to each other in a column direction (e.g., the second direction DR2). The first color filter 331 may be disposed in the first pixel column, the second color filter 332 may be disposed in the second pixel column, and the third color filter 333 may be disposed in the third pixel column. Each of the color filters 331, 332, and 333 may extend irrespective of the pixel row boundaries RL1, RL2, and RL3 disposed apart in the column direction.

In an exemplary embodiment, the first color filter 331 may include a red colorant. The first color filter 331 may block or absorb the blue light L1 from among the blue light L1 and red light L2 emitted from the first light conversion pattern 351. For example, the first color filter 331 may function as a blue light blocking filter to block the blue light and may function as a transmitting filter to selectively transmit the red light L2.

In an exemplary embodiment, the second color filter 332 may include a green colorant. The second color filter 332 may block or absorb the blue light L1 from among the blue light L1 and green light L3 emitted from the second light conversion pattern 352. For example, the second color filter 332 may function as a blue light blocking filter to block the blue light and may function as a transmitting filter to selectively transmit the green light L3.

In an exemplary embodiment, the third color filter 333 may include a blue colorant. The third color filter 333 may transmit blue light L4 emitted from the first scattering pattern 353 to be described below. The third color filter 333 may function as a blue light transmitting filter.

Adjacent color filters 331, 332 and 333 may be partially stacked on each other in the pixel column boundaries CL1, CL2, and CL3, but the present disclosure is not limited thereto. For example, the adjacent color filters 331, 332 and 333 may be disposed separately without overlapping each other.

A first capping layer 341 may be disposed on each of the color filters 331, 332, and 333. The first capping layer 341 may be disposed on entire surfaces of the color filters 331, 332, and 333.

The first capping layer 341 may prevent impurities such as moisture or air from permeating into and damaging the color filters 331, 332, and 333 from the outside.

The first capping layer 341 may be made of an inorganic material. For example, the first capping layer 341 may include at least one selected from among silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride.

The light conversion pattern 350 may be disposed on the first capping layer 341. The light conversion pattern 350 may include a first light conversion pattern 351 and a second light conversion pattern 352.

The first light conversion pattern 351 may convert blue light L1 from the organic layer into red light to emit the red light L2. The second light conversion pattern 352 may convert the blue light L1 from the organic layer into green light to emit the green light L3. The first scattering pattern 353 to be described below may transmit the blue light L1 intact.

Referring to FIG. 4, the first light conversion pattern 351 may include a first base resin 3511 and first wavelength conversion particles 3512 dispersed in the first base resin 3511. The second light conversion pattern 352 may include a second base resin 3521 and second wavelength conversion particles 3522 dispersed in the second base resin 3521. The light conversion patterns 351 and 352 may further include scattering particles dispersed in the base resins 3511 and 3521. In one exemplary embodiment, the scattering particles may be metal oxide particles such as titanium oxide ($TiO_2$), silicon oxide ($SiO_2$), zirconium oxide ($ZrO_2$), aluminum oxide ($Al2O_3$), indium oxide ($In_2O_3$), zinc oxide (ZnO), or tin oxide ($SnO_2$), or organic particles such as an acrylic-based resin or a urethane-based resin. Accordingly, a path length of light passing through the light conversion pattern 350 may be increased, and color conversion efficiency may be increased due to the light conversion pattern.

In some exemplary embodiments, a thickness of the light conversion pattern 350 may be in a range of 3 μm to 15 μm. When the light conversion pattern 350 is formed to have a thickness of 3 or more, it is possible to improve color conversion efficiency of light passing through the light conversion pattern. In some exemplary embodiments, an upper limit of the thickness of the light conversion pattern 350 may be about 15 μm in terms of ease of a process.

In some exemplary embodiments, contents of the first wavelength conversion particles 3512 and the second wavelength conversion particles 3522 included in the first and second light conversion patterns 351 and 352 may be in a range of 10% to 60%. In addition, contents of the scattering particles included in the first and second light conversion patterns 351 and 352 may be less than 5%. In an exemplary embodiment, the content of the scattering particles may be 2% or less. When the content of the scattering particles in the light conversion pattern 350 is 5% or more, transparency of the light conversion pattern 350 may be lowered and thus light extraction efficiency may be lowered.

A material of each of the base resins 3511 and 3521 is not particularly limited. The material may have a high light transmittance and excellent dispersion characteristics with respect to the wavelength conversion particles 3512 and 3522 and the scattering particles. For example, each of the base resins 3511 and 3521 may include an organic material such as an epoxy-based resin, an acrylic-based resin, a cardo-based resin, or an imide-based resin.

The first wavelength conversion particles 3512 may convert the blue light L1 into the red light L2, and the second wavelength conversion particles 3522 may convert the blue light L1 into the green light L3. Examples of the wavelength conversion particles 3512 and 3522 may include quantum dots, quantum rods, fluorescent materials, or the like. For example, the quantum dot may be a particulate matter in which electrons transition from a conduction band to a valence band to emit a specific color. When both of the first wavelength conversion particles 3512 and the second wavelength conversion particles 3522 are composed of quantum dots, a diameter of the quantum dots constituting the first wavelength conversion particles 3512 may be greater than a diameter of the quantum dots constituting the second wavelength conversion particles 3522.

The quantum dots may be a semiconductor nanocrystal material. The quantum dots may have a specific band gap according to the composition and size thereof to absorb light and then to emit light having an intrinsic wavelength. Examples of the semiconductor nanocrystals of the quantum dots include IV group-based nanocrystals, II-VI group-based compound nanocrystals, III-V group-based compound nanocrystals, IV-VI group-based nanocrystals, or combinations thereof. The quantum dots may have a core-shell structure which includes a core and a shell surrounding the core.

The light conversion pattern 350 may be disposed in a stripe form. The first light conversion pattern 351 and the second light conversion pattern 352 may be disposed so as to be integrally connected along the column direction (e.g., the second direction DR2) as in the color filter 330. For example, the first light conversion pattern 351 may be disposed in the first pixel column, and the second light conversion pattern 352 may be disposed in the second pixel column. The first light conversion pattern 351 and the second light conversion pattern 352 may extend irrespective of the pixel row boundaries RL1 and RL2 disposed in the column direction.

Furthermore, the light conversion pattern 350 may be formed to protrude in a thickness direction thereof. In an exemplary embodiment, a thickness of the light conversion pattern 350 may be in a range of about 3 μm to about 15 μm.

The first light conversion pattern 351 and the second light conversion pattern 352 may, be disposed in corresponding pixels PX1 and PX2 when viewed from above. For example, a planar size of the first light conversion pattern 351 and the second light conversion pattern 352 may be less than a size of the pixels PX1 and PX2. Accordingly, the first and second light conversion patterns 351 and 352 may be spaced apart from each other with respect to the first pixel column boundary CL1.

Therefore, stepped portions corresponding to protrusion heights of the light conversion patterns 351 and 352 may be formed between regions in which the first light conversion pattern 351 and the second light conversion pattern 352 are disposed and a region between the first light conversion pattern 351 and the second light conversion pattern 352.

A second capping layer 342 may be disposed on the light conversion pattern 350. The second capping layer 342 may cover the light conversion pattern 350.

The second capping layer 342 may include an inorganic material. The second capping layer 342 may be made of the same material as the first capping layer 341 or may be made of at least one selected from among the materials exemplified in the description of the first capping layer 341.

The first scattering pattern 353 and the second scattering pattern 360 may be disposed on the second capping layer 342.

Referring to FIG. 4, the first light conversion pattern 351 may be disposed in a first region. The second light conversion pattern 352 may be disposed in a second region and is spaced apart from the first light conversion pattern 351. The first scattering pattern 353 may be disposed in a third region and fills a space between the first light conversion pattern 351 and the second light conversion pattern 352. The first scattering pattern 353 may be disposed to overlap a portion of the first light conversion pattern 351 and a portion of the second light conversion pattern 352. The first scattering pattern 353 may include a third base resin 3531 and scattering particles 3533, and the second scattering pattern 360 may include a fourth base resin 3611 and scattering particles 3613.

In an exemplary embodiment, the first scattering pattern 353 and the second scattering pattern 360 may be made of the same material and may be concurrently formed through one process. A specific forming method will be described below with reference to FIGS. 6 and 7.

The scattering particles 3533 and 3613 may have a refractive index different from that of the third base resin 3531 and the fourth base resin 3611 and thus may form optical interfaces together with the third base resin and the fourth base resin. For example, the scattering particles 3533 and 3613 may be not scattering particles. A material of the scattering particles 3533 and 3613 is not particularly limited. The material of the scattering particles 3533 and 3613 may scatter a portion of transmitted light. For example, in an exemplary embodiment, the scattering particles 3533 and 3613 may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include an acrylic-based resin, a urethane-based resin, and the like. Scattering particles 3533 and 3613 may scatter light in a random direction irrespective of an incidence direction of incident light without substantially changing a wavelength of light passing through the first scattering pattern 353 and second scattering pattern 360.

The material of the third base resin 3531 and the fourth base resin 3611 is not particularly limited. The material of the third base resin 3531 may have high light transmittance and excellent dispersion characteristics with respect to the scattering particles 3533 and 3611. For example, each of the base resins 3531 and 3613 may include an organic material such as an epoxy-based resin, an acrylic-based resin, a cardo-based resin, or an imide-based resin.

The second scattering pattern 360 may be disposed in a stripe form similar to the light conversion pattern 350. The second scattering pattern 360 may, be formed integrally along the pixel column boundary CL1.

The second scattering pattern 360 may overlap the light blocking pattern 320 in a thickness direction thereof. The second scattering pattern 360 may overlap the light blocking pattern 320 at the pixel column boundary CL1. As shown in the exemplary embodiment of FIG. 2, a planar width of the second scattering pattern 360 may be greater than a planar width of the light blocking pattern 320. However, exemplary embodiments of the present inventive concepts are not limited thereto and the planar width of the second scattering pattern 360 may be less than or equal to the planar width of the light blocking pattern 320.

The second scattering pattern 360 may be disposed between adjacent first and second regions to till a space between the first light conversion pattern 351 and the second light conversion pattern 352. Furthermore, as shown in FIG. 2, the second scattering pattern 360 may extend to partial regions of surfaces of adjacent light conversion patterns 351 and 352 and may be disposed to overlap the light conversion patterns 351 and 352 in a thickness direction thereof.

In addition, the second scattering pattern 360 may be formed to protrude further in the thickness direction thereof as compared with a surface of each of the light conversion patterns 351 and 352.

The first scattering pattern 353 may include flat portions 353a, first overlap portions 353b, and second overlap portions 353c.

The flat portions 353a of the first scattering pattern 353 may be disposed approximately in a stripe form. The flat portions 353a may be connected integrally along the column direction (e.g., the second direction DR2) as in the color filter 330. For example, the flat portions 353a may be disposed in the third pixel column.

In some exemplary embodiments, the flat portion 353a may be formed to have the same thickness as the thickness of the light conversion pattern 350.

The first and second overlap portions 353b and 353c of the first scattering pattern 353 may at least partially overlap regions of the light blocking patterns 320 in thickness directions thereof. The first and second overlap portions 353b and 353c may be formed integrally along the pixel column boundaries CL2 and CL3. A planar width of the first and second overlap portions 353b and 353c may be less than the planar width of the second scattering pattern 360. In an exemplary embodiment, the planar width of the first and second overlaps 353h and 353c may be approximately half of the planar width of the second scattering pattern 360.

The first overlap portion 353b may extend to a partial region of a surface of the second light conversion pattern 352 adjacent thereto, may be disposed to overlap the second light conversion pattern 352 in the thickness direction thereof, and may be formed to protrude further in the thickness direction thereof as compared with the surface of the second light conversion pattern 352. The second overlap portion 353c may extend to a partial region of a surface of the first light conversion pattern 351 adjacent thereto, may be disposed to overlap the first light conversion pattern 351 in the thickness direction thereof, and may be formed to further protrude in the thickness direction thereof as compared with the surface of the first light conversion pattern 351.

As described above, the second scattering pattern 360 and the first and second overlap portions 353b and 353c of the first scattering pattern 353 may be disposed at boundaries of adjacent pixels CL1, CL2, CL3, thereby preventing light mixing between the pixels PX1, PX2, and PX3.

This will be described in detail with reference to FIG. 4. The blue light L1 emitted from each of the organic light-emitting elements ED1, ED2, and ED3 may travel in an upward direction of a corresponding one of the pixels PX1, PX2, and PX3 of the display device hut may also travel in a lateral direction toward adjacent pixels PX1, PX2, and PX3. The light emitted from each of the organic light-emitting elements ED1, ED2, and ED3 may also be provided to the light conversion patterns 351 and 352 and the first scattering pattern 353 of the adjacent pixels, which causes undesired adjacent pixels to emit light due to a leakage current.

However, in the display device 1 according to the present exemplary embodiment, the second scattering pattern 360 and the overlap portion 353$h$ of the first scattering pattern 353 may be disposed between adjacent light conversion patterns 351 and 352. Thus, the second scattering pattern 360 and the overlap portion 353$b$ may fill spaces between the light conversion patterns 351 and 352 and the first scattering pattern 353 and concurrently may be formed to further protrude in the thickness direction thereof as compared with the surfaces of the light conversion patterns 351 and 352 and the first scattering pattern 353.

As described above, the second scattering pattern 360 and the first and second overlap portions 353$b$ and 353$c$ of the first scattering pattern 353 may include the scattering particles 3533 and 3613.

Generally, the scattering particles may scatter incident light and function to uniformly control an emission angle of light according to a wavelength. For example, an emission direction of light passing through the scattering particles has random scattering characteristics, thereby improving viewing angle characteristics of the display device.

The scattering particles may scatter light in a random direction irrespective of an incidence direction of incident light so that at least a portion of the incident light may be emitted in a direction opposite to a traveling path of the incident light. For example, as shown in FIG. 4, light emitted from the organic light-emitting element ED1 may be incident on a left side of the second scattering pattern 360. In this case, in an exemplary embodiment which assumes that light passing through the scattering particles 3613 is emitted through five different paths, light emitted in a first emission direction OD1 and a second emission direction OD2 may not be incident on the second light conversion pattern 352. Similarly, at least a portion of light emitted from other organic light-emitting elements ED2 and ED3 may also be emitted in a direction opposite to a traveling direction of the light by the scattering particles 3533 and 3613 included in the second scattering pattern 360 and the first and second overlap portions 353$b$ and 353$c$ of the first scattering pattern 353 and may not be incident on an adjacent light conversion pattern 350 or first scattering pattern 353.

Therefore, the light emitted from each of the organic light-emitting elements ED1, ED2, and ED3 may be prevented from traveling in a lateral direction to travel to the adjacent pixels PX1, PX2, and PX3. Accordingly, it is possible to prevent degradation of color purity caused by the adjacent pixels PX1, PX2, PX3.

In an exemplary embodiment, the light blocking member used to prevent color mixing of adjacent pixels may be formed of at least one selected from among an opaque organic material, a chromium-containing metal material, and carbon black. Accordingly, the light emitted from each of the organic light-emitting elements ED1, ED2, and ED3 may be absorbed by the light blocking member so that an amount of light incident on the wavelength conversion pattern may be decreased. Therefore, when the second scattering pattern 360, which does not include an opaque organic material or the like, is used as the light blocking member, an amount of light applied to the wavelength conversion pattern may be increased, thereby increasing wavelength conversion efficiency.

Figure 5:
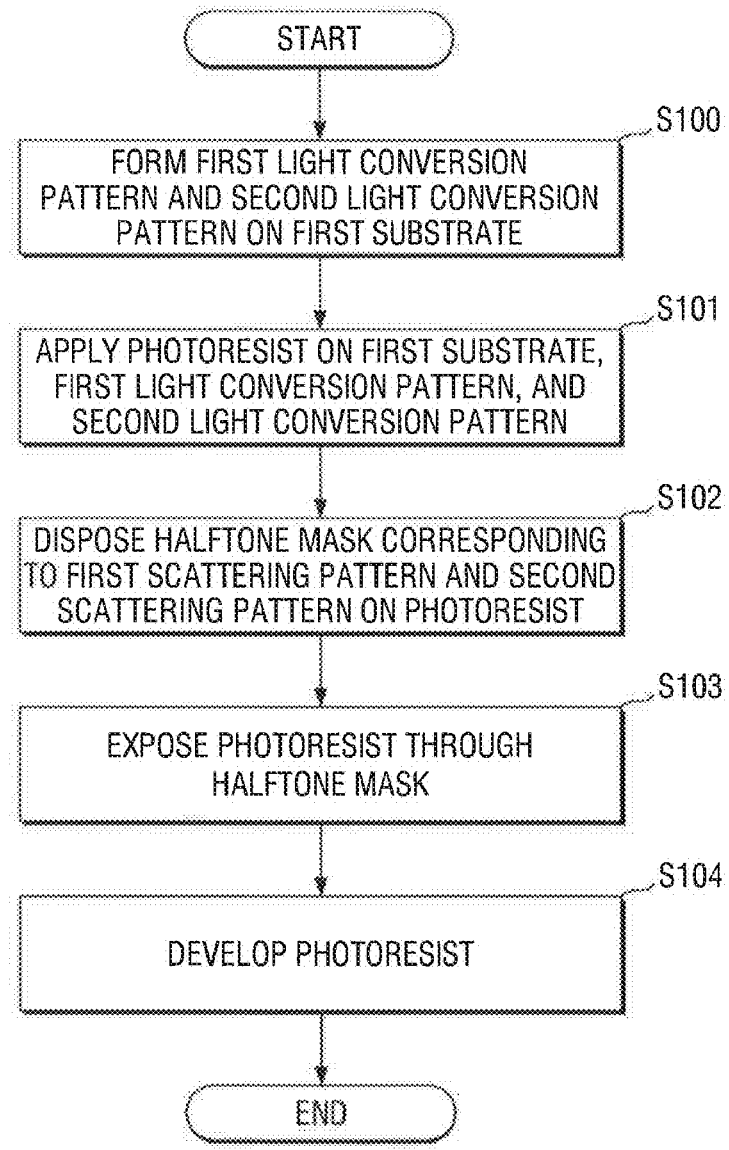
FIG. 5 is a flowchart illustrating a method of forming a first scattering pattern and a second scattering pattern according to an exemplary embodiment of the present inventive concepts.
Figure 6:
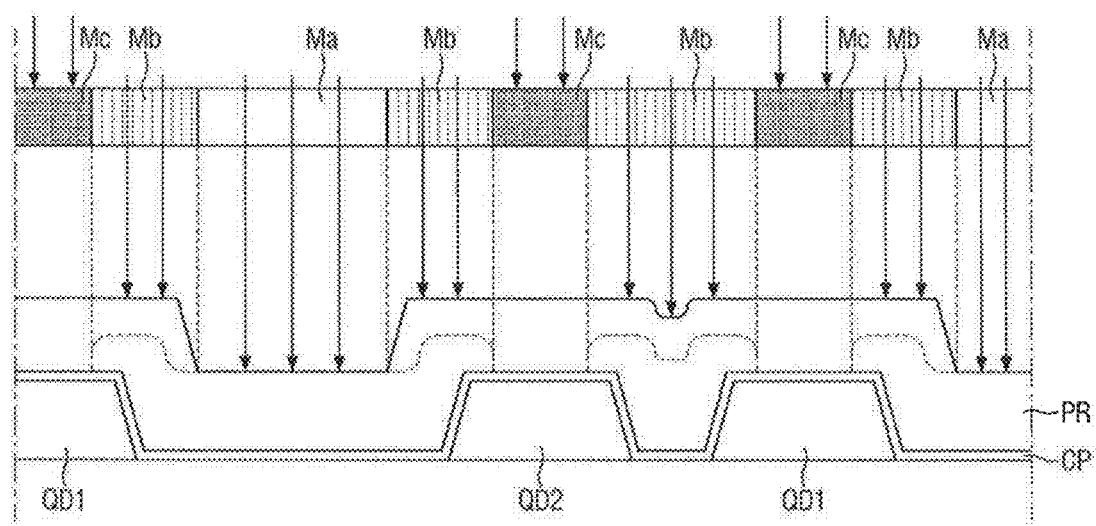
FIGS. 6 and 7 are cross-sectional views illustrating the method of forming the first scattering pattern and the second scattering pattern according to an exemplary embodiment of the present inventive concepts.
Figure 7:
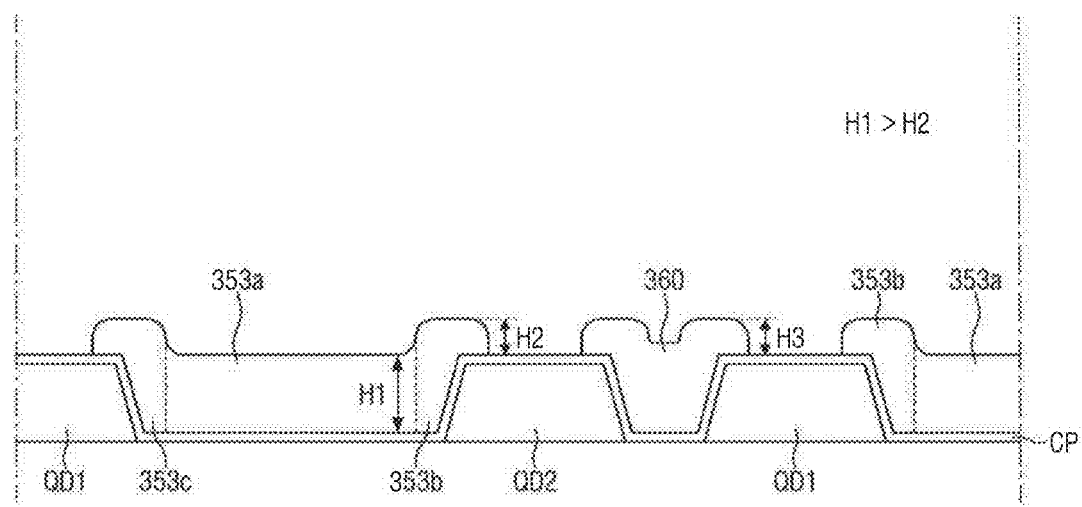

FIG. 5 is a flowchart illustrating a method of forming a first scattering pattern and a second scattering pattern according to an exemplary embodiment. FIGS. 6 and 7 are cross-sectional views illustrating the method of forming a first scattering pattern 353 and a second scattering pattern 360 according to the exemplary embodiment.

Referring to FIGS. 5 to 7, in block S100 light conversion pattern layers QD1 and QD2 may be formed on a first substrate. A capping layer CP may be formed on portions of the first substrate that are not covered by the light conversion pattern layers QD1 and QD2.

In block S101, a photoresist may be applied on the capping layer CP covering the light conversion pattern layers QD1 and QD2. The photoresist may be a photosensitive organic film PR. An upper surface of the photosensitive organic film may be formed to be substantially parallel to an upper surface of the capping layer CP. For example, the photosensitive organic film PR may be made of at least one organic material selected from among benzocyclobutene (BCB), polyimide (PI), polyimide (PA), an acrylic resin, and a phenolic resin.

The photosensitive organic film PR may include scattering particles. The scattering particles may be light scattering particles. A material of the scattering particles is not particularly limited. The material of the scattering particles may scatter at least a portion of transmitted light, and for example, the scattering particles may be metal oxide particles or organic particles. In exemplary embodiments, the metal oxide may include titanium oxide ($TiO_7$), zirconium oxide ($ZrO_2$), aluminum oxide ($Al_2O_3$), indium oxide ($In_2O_3$), zinc oxide (ZnO), tin oxide ($SnO_2$), and the like. In exemplary embodiments, the material of the organic particles may include an acrylic-based resin, a urethane-based resin, and the like.

In block S102, a semi-transparent exposure process may be performed. For example, a semi-transparent exposure process may be performed using a halftone mask or a slit mask. The halftone mask corresponding to the first scattering pattern and the second scattering pattern may be disposed on the photosensitive organic film PR. Hereinafter, a description of the process will be provided by exemplifying a case in which the photosensitive organic film PR may be formed using a photosensitive layer including a negative photosensitive material. However, the present disclosure is not limited thereto, and in other exemplary embodiments, the photosensitive organic film PR may also be formed using a photosensitive layer including a positive photosensitive material. In this embodiment, a region from which the photosensitive organic film PR is to be removed by a halftone mask (11M) or a slit mask, a region in which the photosensitive organic film PR remains and thus the second scattering pattern 360 is to be formed, and a region in which the photosensitive organic film PR remains and thus the first scattering pattern 353 is to be formed are exposed to different extents.

The HM or the slit mask may include a first light transmitting portion Ma configured to transmit 100% of light, a second light transmitting portion configured to transmit about half of light, and a third light transmitting portion Mc configured to hardly transmit light. The HM the slit mask may be disposed such that the first light transmitting portion Ma corresponds to a region in which the photosensitive organic film PR remains and thus a flat portion 353$a$ of the first scattering pattern 353 is to be formed. The second light transmitting portion Mb may correspond to a region in which approximately half of the photosensitive organic film PR remains and thus the second scattering pattern 360 and first and second overlap portions 353b and 353c of the first scattering pattern 353 are to be formed. The third light scattering portion Mc may correspond to the region from which the photosensitive organic film PR is to be removed. However, in exemplary embodiments in which a positive photosensitive material is applied as the photosensitive organic film PR, positions of the second light transmitting portion Mb and the first light transmitting portion Ma may be modified accordingly.

In block S103 exposure may be performed by irradiating irradiation light, such as ultraviolet (UV) light or a continuous wave (CW) laser used in a normal patterning process, from above a light adjustment mask device M.

In block S104, a process of developing the exposed photosensitive organic film PR may be performed. The photosensitive organic film PR remains intact through the development at a portion 100% exposed by the first light transmitting portion Ma. Therefore, the portion which is 100% exposed takes a shape of the flat portion 353a of the first scattering pattern 353. The photosensitive organic film PR may be removed from a portion at which 100% of light is blocked by the third light transmitting portion Mc and the capping layer CP may be exposed. About half of the photosensitive organic film PR may remain in a region of the second light transmitting portion Mb, through which about half of light passes, and thus, the second scattering pattern 360 and the first and second overlap portions 353b and 353c of the first scattering pattern 353 may be formed.

As a result, as shown in FIG. 7, it is possible to form a structure in which the flat portion 353a of the first scattering pattern 353 which correspond to the light conversion patterns 351 and 352 and the first and second overlap portions 353b and 353e of the first scattering pattern 353 which correspond to the second scattering pattern 360 are formed integrally. In an exemplary embodiment, a thickness H1 of the flat portion 353a of the first scattering pattern 353 may be about twice as great as a protruding thickness H2 that the first and second overlap portions 353b and 353c of the first scattering pattern 353 protrude further in the thickness direction than the surface of the light conversion pattern 350. The protruding thickness H2 that the first and second overlap portions 353b and 353c of the first scattering pattern 353 protrude further in the thickness direction than the surface of the light conversion pattern 350 may be the same as the protruding thickness H3 that the second scattering pattern 360 protrudes further in the thickness direction than the surface of the light conversion pattern.

Exemplary embodiments of the present inventive concepts avoid the inconvenience of conventionally using a mask process two times. One mask process may be reduced to omit a process for asking or stripping a photoresist film.

Hereinafter, other exemplary embodiments will be described. In the following exemplary embodiments, the same reference numerals will be given to the same components as the exemplary embodiments described above, and descriptions thereof will be omitted or simplified.

Figure 8:
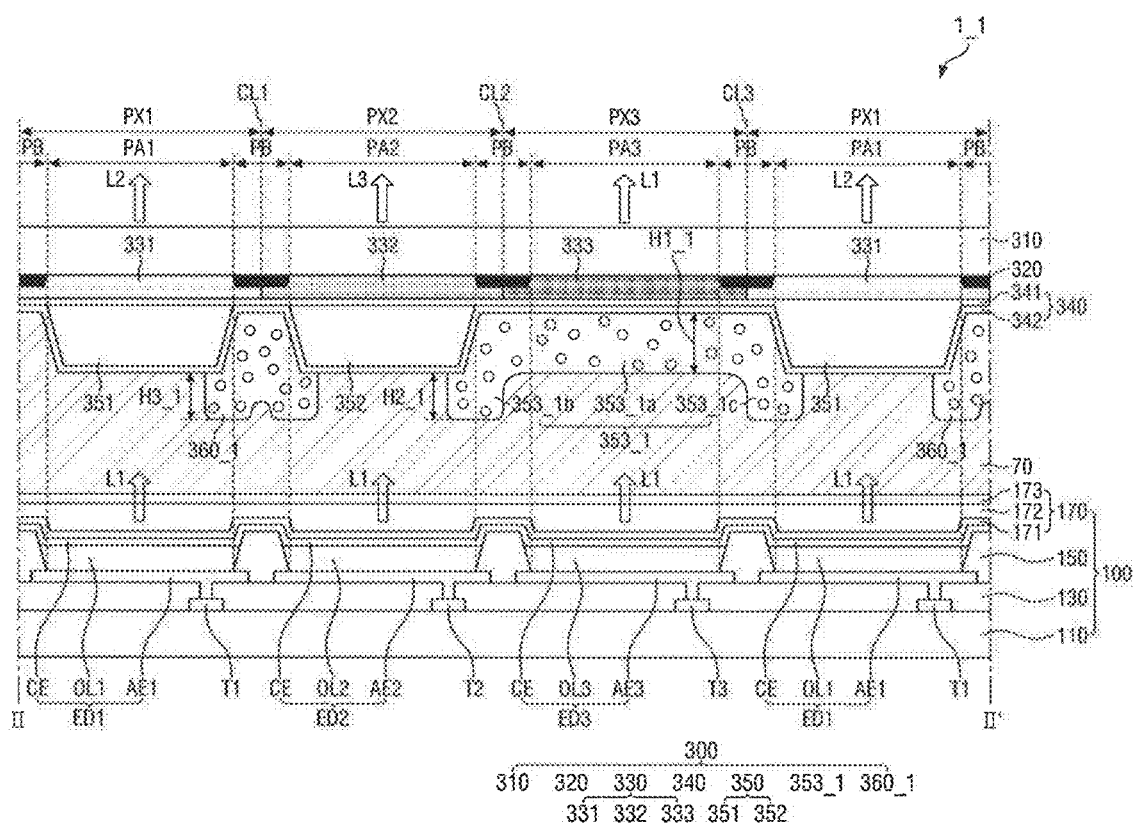
FIG. 8 is a cross-sectional view of a display device which is taken along line II-II' of FIG. 1 according to another exemplary embodiment of the present inventive concepts.
Figure 9:
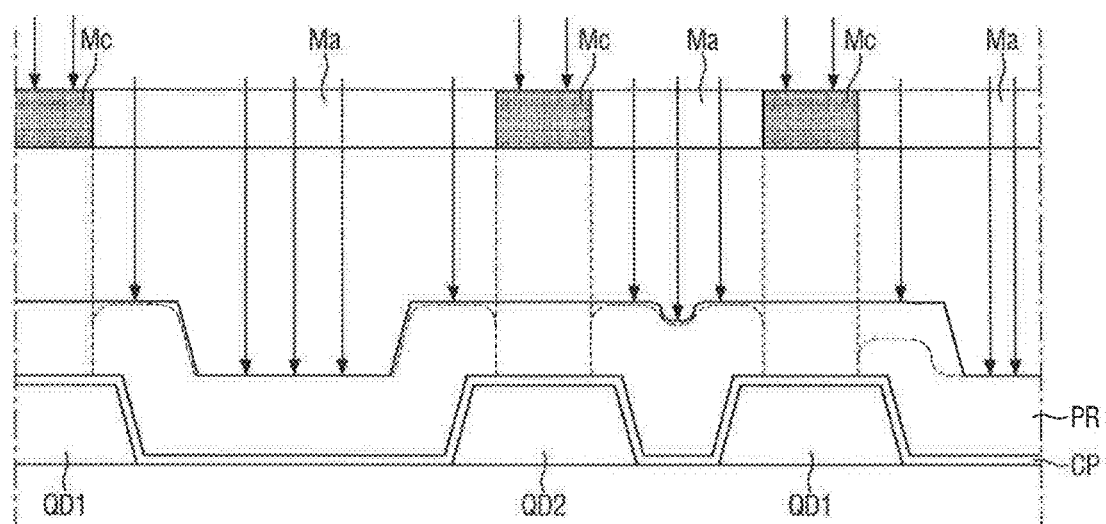
FIGS. 9 and 10 are cross-sectional views illustrating a method of forming a first scattering pattern and a second scattering pattern according to another exemplary embodiment of the present inventive concepts.
Figure 10:
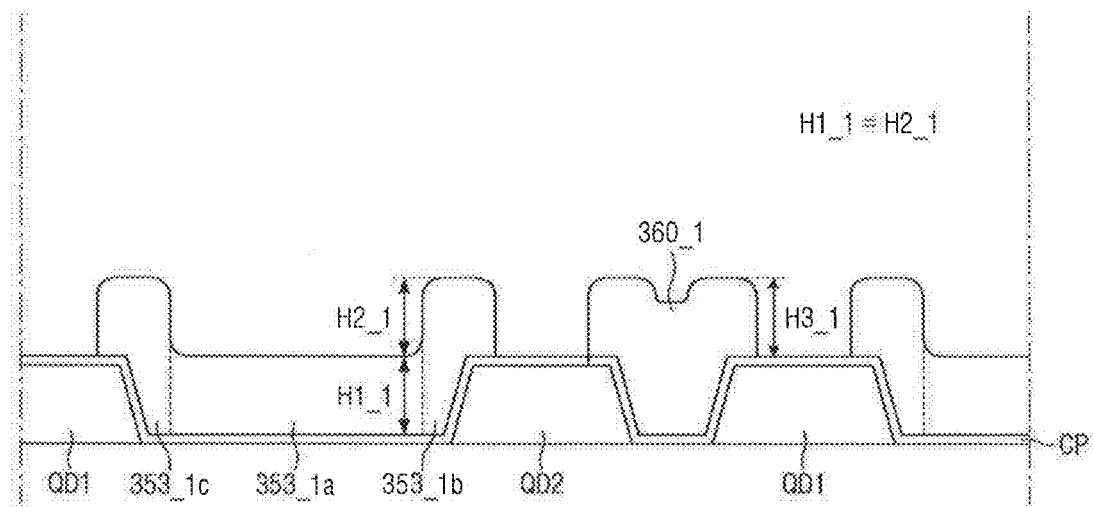

FIG. 8 is a cross-sectional view of a display device which is taken along line II-IF of FIG. 1 according to another exemplary embodiment. FIGS. 9 and 10 are cross-sectional views illustrating a method of forming a second scattering pattern and a first scattering pattern according to another exemplary embodiment Referring to FIG. 8, configurations of a first scattering pattern 353_1 and a second scattering pattern 360_1 of a display device 1_1 according to the present exemplary embodiment are different from the configurations of the first scattering pattern 353 and the second scattering pattern 360 of the display device 1 shown in FIG. 2, and other components are substantially the same or similar. Therefore, differences are mainly described below.

The first scattering pattern 353_1 and the second scattering pattern 360_1 may be different from the first scattering pattern 353 and the second scattering pattern 360 shown in FIG. 2 in that a thickness H1_1 of a flat portion 353_1a of the first scattering pattern 353_1 is approximately the same as a protruding thickness H2_1 of the first and second overlap portions 353_1b and 353_1c of the first scattering pattern 353_1.

The protruding thickness H2_1 that the overlap portion 353_1b of the first scattering pattern 353_1 protrudes further in the thickness direction than the surface of the light conversion pattern 350 and a protruding thickness H3_1 that the second scattering pattern 360_1 protrudes further in the thickness direction than the surface of the light conversion pattern shown in FIG. 8 may be about twice as great as the protruding thickness H2 of the first and second overlap portions 353b and 353c of the first scattering pattern 353 and the protruding thickness H3 of the second scattering pattern 360 shown in FIG. 2.

Thus, light emitted from each of organic light-emitting elements ED1, ED2, and ED3 may be further prevented from traveling in a lateral direction to travel to the adjacent pixels FX1 PX2, and PX3. Accordingly, it is possible to prevent color mixing between adjacent pixels, thereby improving color purity of a pixel.

The description has been provided by exemplifying a case in which contents of scattering particles included in the first scattering pattern 353_1 and the second scattering pattern 360_1 shown in FIG. 8 is the same as contents of the scattering pattern included in the first scattering pattern 353 and the second scattering pattern 360 shown in FIG. 2.

However, the contents of the scattering particles included in the first scattering pattern 353_1 and the second scattering pattern 360_1 shown in FIG. 8 may be less than the contents of the scattering particles included in the first scattering pattern 353 and the second scattering pattern 360 shown in FIG. 2.

As described above, as the thicknesses of the overlap portions of the first scattering pattern and the second scattering pattern are increased, light emitted from each of the organic light-emitting elements ED1, ED2, and ED3 may be further prevented from traveling in the lateral direction to travel to the adjacent pixels PX1, PX2, and PX3. However, a probability that the light emitted from each of the organic light-emitting elements ED1, ED2, and ED3 may excite wavelength conversion particles 3532 included in the first scattering pattern may be lowered. Accordingly, the contents of the included scattering particles may be decreased in proportion to an increase in the thicknesses of the overlap portions of the first scattering pattern and the second scattering pattern.

Referring to FIGS. 8 and 10, a photosensitive organic film PR may be formed on a capping layer CP covering light conversion pattern layers QD1 and QD2. An upper surface of the photosensitive organic film PR may be formed to be substantially parallel to an upper surface of the capping layer CP. In an exemplary embodiment, the photosensitive organic film PR may be made of at least one organic material selected from among BCE, PI, PA, an acrylic resin, and a phenolic resin.

The photosensitive organic film PR may include scattering particles. The scattering particles may be light scattering particles. A material of the scattering particles may not be particularly limited. The material of the scattering particles may scatter at least a portion of transmitted light. For example, in an exemplary embodiment, the scattering particles may be metal oxide particles or organic particles. Examples of the metal oxide may include titanium oxide ($TiC_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include an acrylic-based resin, a urethane-based resin, and the like.

An exposure process may be performed. The exposure process may be performed by, irradiating irradiation light, such as UV light or a CW laser used in a normal patterning process from above a light adjustment mask device M.

Hereinafter, descriptions will be provided by exemplifying a case in which the photosensitive organic film PR is formed using a photosensitive layer including a negative photosensitive material. However, the present disclosure is not limited thereto, and in other exemplary embodiments, the photosensitive organic film PR may also be formed using a photosensitive layer including a positive photosensitive material. In this embodiment, a region in which the photosensitive organic film PR remains and thus the first scattering pattern 353 and the second scattering pattern 360 are to be formed by a first light transmitting portion Ma, and a region from which the photosensitive organic film PR is to be removed by a third light transmitting portion Mc are exposed to different extents.

A mask may include the first light transmitting portion Ma configured to transmit 100% of light and the third light transmitting portion Mc configured to hardly transmit light. The mask may be disposed such that the first light transmitting portion Ma corresponds to the region in which the photosensitive organic film PR remains, and thus the first scattering pattern 353 and the second scattering pattern 360 are to be formed, and the third transmitting portion Ma corresponds to the region from which the photosensitive organic film PR is to be removed. However, in exemplary embodiments in which a positive photosensitive material is applied as the photosensitive organic film PR, positions of the first light transmitting portion Ma and the third light transmitting portion Mc may be modified accordingly.

The photosensitive organic film PR remains intact through development at a portion which is 100% exposed by the first light transmitting portion Ma, and thus, the portion which is 100% exposed takes shapes of the first scattering pattern 353 and the second scattering pattern 360. Also, the photosensitive organic film PR may be removed from a portion at which 100% of light is blocked by the third light transmitting portion Mc, and thus, the capping layer CP may be exposed.

As a result, as shown in FIG. 10, it is possible to form a structure in which the flat portion 353_1a of the first scattering pattern 353_1 corresponding to the light conversion pattern 350 and the overlap portion 353_1b of the first scattering pattern 353_1 corresponding to the second scattering pattern 360_1 are formed integrally. Specifically, a thickness H1_1 of the flat portion 353_1a of the first scattering pattern 353_1 may be the same as a protruding thickness H2_1 of the overlap portion 353_1b of the first scattering pattern 353_1. The thickness H2_1 of the overlap portion 353_1b of the first scattering pattern 353_1 may be the same as a protruding thickness H3_1 of the second scattering pattern 360_1.

Figure 11:
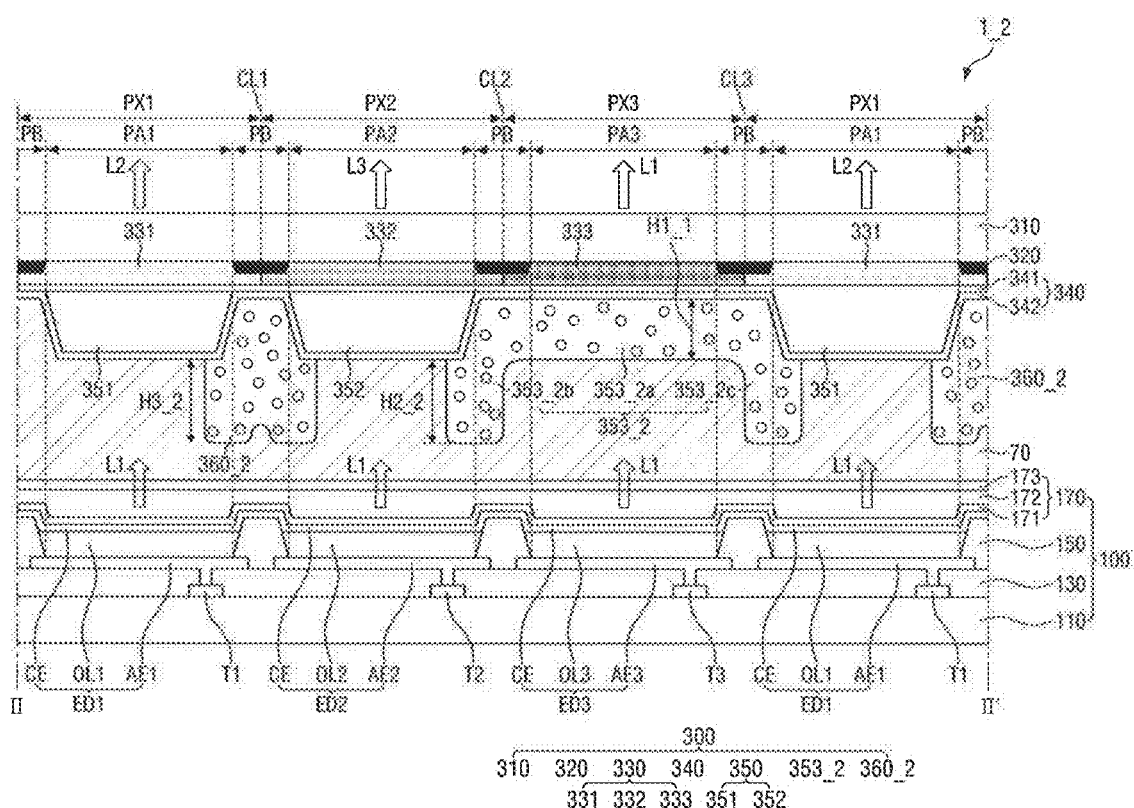
FIG. 11 is a cross-sectional view of a display device which is taken along line II-II' of FIG. 1 according to still another exemplary embodiment of the present inventive concepts.
Figure 12:
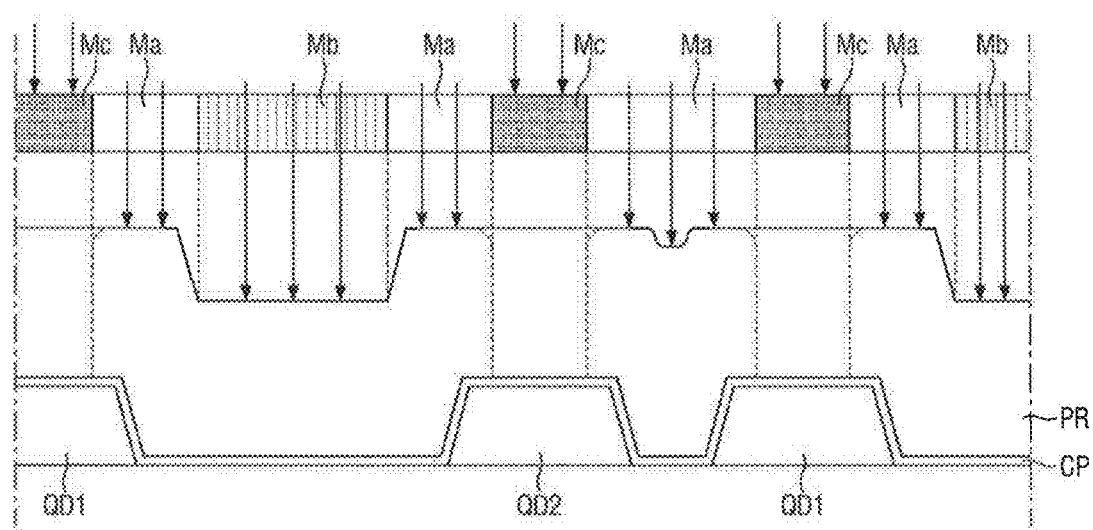
FIGS. 12 and 13 are cross-sectional views illustrating a method of forming a first scattering pattern and a second scattering pattern according to still another exemplary embodiment of the present inventive concepts.
Figure 13:
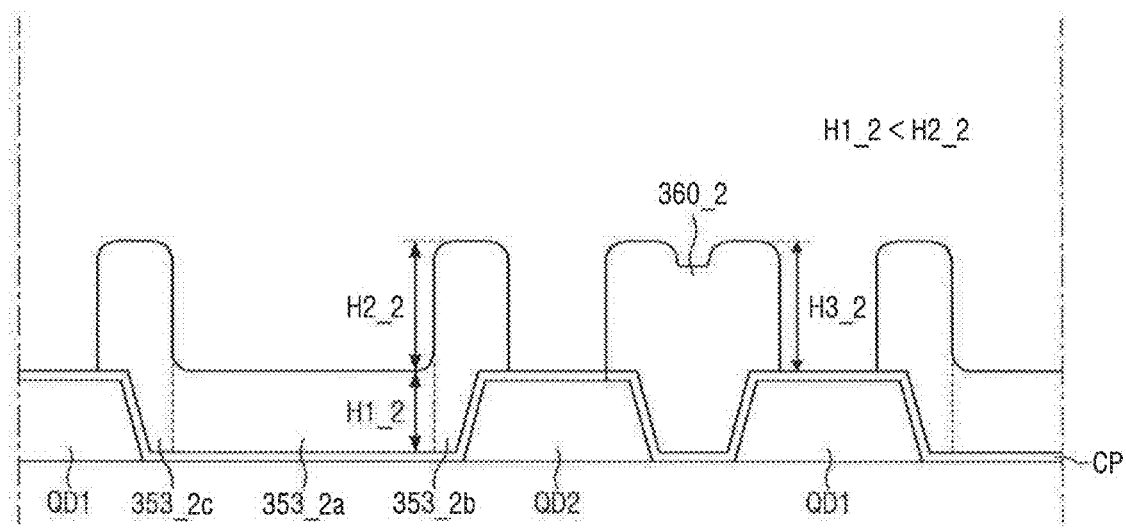

In an exemplary embodiment, the process may be performed only using the first light transmitting portion Ma configured to completely transmit light and the third light transmitting portion Mc configured to completely block light so that uniform patterning may be expected even when a size of a mask is greater than or equal to a certain size FIG. 11 is a cross-sectional view of a display device which is taken along line of FIG. 1 according to still another exemplary, embodiment, and FIGS. 12 and 13 are views illustrating a method of forming a first scattering pattern and a second scattering pattern according to still another exemplary embodiment.

Referring to FIG. 11, configurations of a first scattering pattern 353_2 and a second scattering pattern 360_2 of a display device 1_2 according to the present exemplary embodiment are different from the configurations of the first scattering pattern 353 and the second scattering pattern 360 of the display device 1 shown in FIG. 2, and other components are substantially the same or similar. Therefore, differences are mainly described below.

Specifically, the first scattering pattern 353_2 and the second scattering pattern 360_2 are different from the first scattering pattern 353 and the second scattering pattern 360 shown in FIG. 2 in that a protruding thickness H2_2 of first and second overlap portions 353_2b and 353_2c of the first scattering pattern 353_2 is greater than a thickness H1_1 of a flat portion 353_2a of the first scattering pattern 353_2.

In other words, the protruding thicknesses H2_2 of the first and second overlap portions 353_2b and 353_2c of the first scattering pattern 353_2 and the protruding thickness H3_2 of the second scattering pattern 360_2 shown in FIG. 11 may be about four times as great as the protruding thickness H2 of the first and second overlap portions 353b and 353c of the first scattering pattern 353 and the protruding thickness H3 of the second scattering pattern 360 shown in FIG. 2.

Thus, light emitted from each of organic light emitting elements ED1, ED2, and ED3 may be further prevented from traveling in a lateral direction to travel to the adjacent pixels PX1, PX2, and PX3. Therefore, it is possible to prevent color mixing between adjacent pixels, thereby improving color purity of a pixel.

The description has been provided by exemplifying a case in which the thickness of light conversion patterns 351 and 352 and the thickness of the flat portion of the first scattering pattern 353_2 shown in FIG. 11 are the same as the thickness of the light conversion patterns 351 and 352 and the thickness of the flat portion of the first scattering pattern 353 shown in FIG. 2

However, wavelength conversion efficiency of wavelength conversion particles included in the light conversion patterns 351 and 352 shown in FIG. 11 may be higher than wavelength conversion efficiency of the wavelength conversion particles included in the light conversion patterns 351 and 352 shown in FIG. 2. In this embodiment, the thickness of the light conversion pattern shown in FIG. 11 may be less than the thickness of the light conversion pattern shown in FIG. 2. In this embodiment, the height of the first scattering pattern and the second scattering pattern shown in FIG. 11 may be the same as a height of the first scattering pattern and the second scattering pattern shown in FIG. 2 or 8.

Referring to FIGS. 12 and 13, first, a photosensitive organic film PR_1 may be formed on a capping layer CP covering light conversion pattern layers QD1 and QD2. An upper surface of the photosensitive organic film PR_1 may be formed to be substantially parallel to an upper surface of the capping layer CP. In this embodiment, when an amount of the photosensitive organic film PR_1 applied on the capping layer CP is adjusted, a thickness of the first scattering pattern 353_2 and the second scattering pattern 360_2 may be adjusted. Descriptions will be provided by exemplifying a case in which the thickness of the photosensitive organic film PR_1 shown in FIG. 12 is about twice the thickness of the photosensitive organic film PR shown in FIG. 6.

For example, in an exemplary embodiment the photosensitive organic film PR_1 may be made of at least one organic material selected from among BCB, PI, PA, an acrylic resin, and a phenolic resin.

The photosensitive organic film PR_1 may include scattering particles. The scattering particles may be light scattering particles. A material of the scattering particles is not particularly limited. The material of the scattering particles may scatter at least a portion of transmitted light. For example, in an exemplary embodiment the scattering particles may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include an acrylic-based resin, a urethane-based resin, and the like.

A semi-transmissive exposure process (for example, using a HM or a slit mask) may be performed. In this embodiment, exposure may be performed by irradiating irradiation light, such as UV light or a CW laser used in a normal patterning process, from above a light adjustment mask device M.

Hereinafter, descriptions will be provided by exemplifying a case in which the photosensitive organic film PR_1 is formed using a photosensitive layer including a negative photosensitive material. However, the present disclosure is not limited thereto, and in other exemplary embodiments, the photosensitive organic film PR_1 may also be formed using a photosensitive layer including a positive photosensitive material, in this embodiment, a region from which the photosensitive organic film PR_1 is to be removed by a HM or a slit mask, a region in which the photosensitive organic film PR_1 remains and thus the second scattering pattern 35_2 and the second scattering pattern 360_2 are to be formed are exposed to different extents.

The HM or the slit mask includes a first light transmitting portion Ma configured to transmit 100% of light, a second light transmitting portion configured to transmit about half of light, and a third light transmitting portion Mc configured to hardly transmit light. The HM or the slit mask may be disposed such that the first light transmitting portion Ma corresponds to a region in which the photosensitive organic film PR_1 may remain and thus the second scattering pattern 360_2 and an overlap portion 353_2b of the first scattering pattern 353_2 are to be formed, the second light transmitting portion Mb corresponds to a region in which approximately half of the photosensitive organic film PR_1 may remain and thus a flat portion 353_2a of the first scattering pattern 353_2 is to be formed, and the third light scattering portion Mc may correspond to a region from which the photosensitive organic film PR_1 is to be removed. However, when a positive photosensitive material is applied as the photosensitive organic film PR_1, positions of the first light transmitting portion Ma and the second light transmitting portion Mb may be changed.

Therefore, the photosensitive organic film PR_1 remains intact through development at a portion of which 100% is exposed by the first light transmitting portion Ma, and thus, the portion of which 100% is exposed takes shapes of the overlap portion 353_2b of the first scattering pattern 353_2 and the second scattering pattern 360_2. In addition, the photosensitive organic film PR_1 is removed from a portion at which 100% of light is blocked by the third light transmitting portion Mc, and thus, the capping layer CP is exposed. About half of the photosensitive organic film PR_1 remains in a region of the second light transmitting portion Mb, through which about half of light passes, and thus, the second scattering pattern 360_2 and the flat portion 353_2a of the first scattering pattern 353_2 are formed.

As a result, as shown in FIG. 13, a structure may be formed in which the flat portion 353_2a of the first scattering pattern 353_2 corresponding to the light conversion pattern layers QD1 and QD2 and first and second overlap portions 353_2b and 353_2c of the first scattering pattern 353_2 corresponding to the second scattering pattern 360_2 are formed integrally. A protruding thickness H2_2 of the first scattering pattern 353_2 may be about twice as great as a thickness H1_2 of the flat portion 353_2a of the first scattering pattern 353_2. A protruding thickness H2_2 of the overlap portion 353_1b of the first and second overlap portions 353_2b and 353_2c of the first scattering pattern 353_2 may be the same as a protruding thickness H3_2 of the second scattering pattern 360_2.

Figure 14:
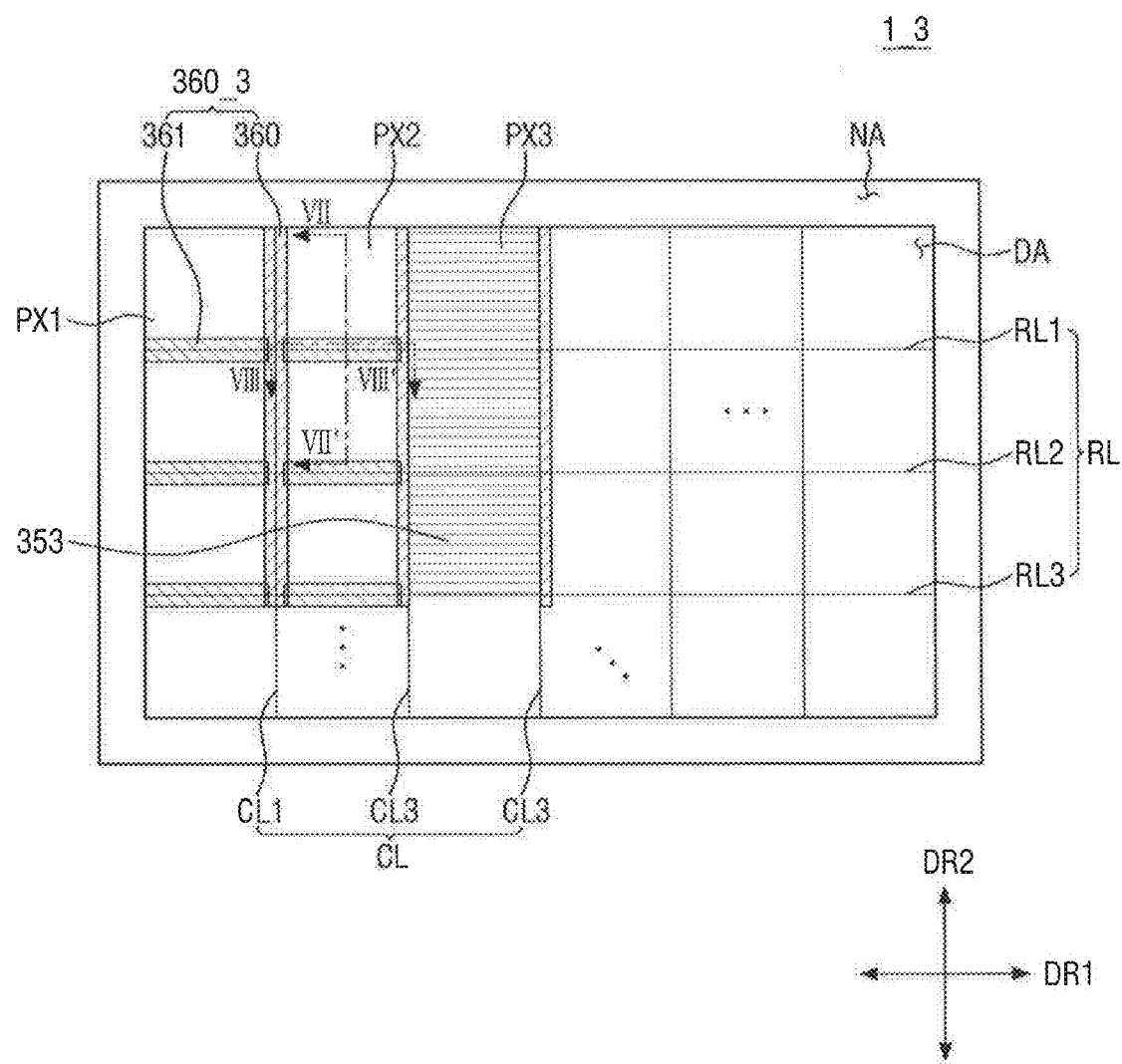
FIG. 14 is a plan view illustrating an arrangement of pixels, a second scattering pattern, and a first scattering pattern of a display device according to another exemplary embodiment of the present inventive concepts.
Figure 15:
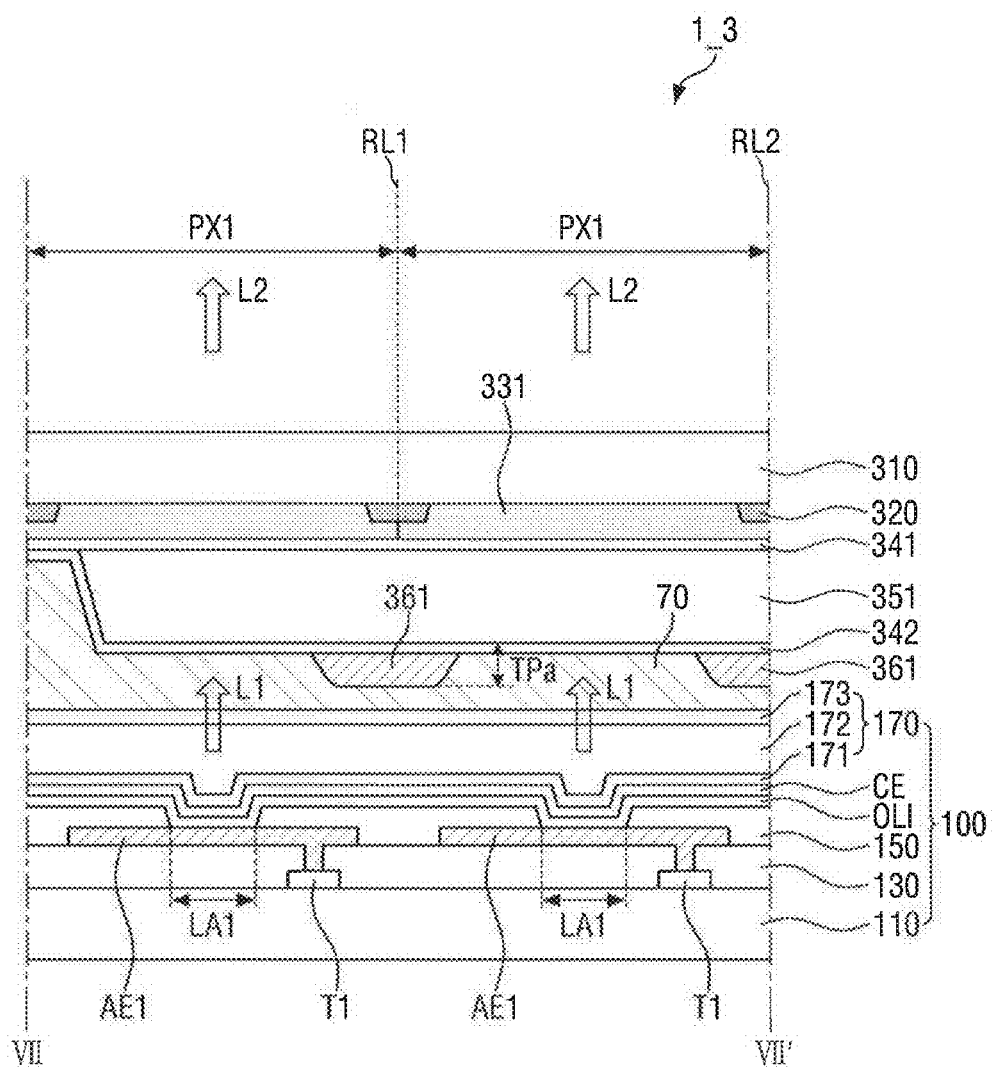
FIG. 15 is a cross-sectional view of a display device which is taken along line VII-VII' of FIG. 14 according to an exemplary embodiment of the present inventive concepts.
Figure 16:
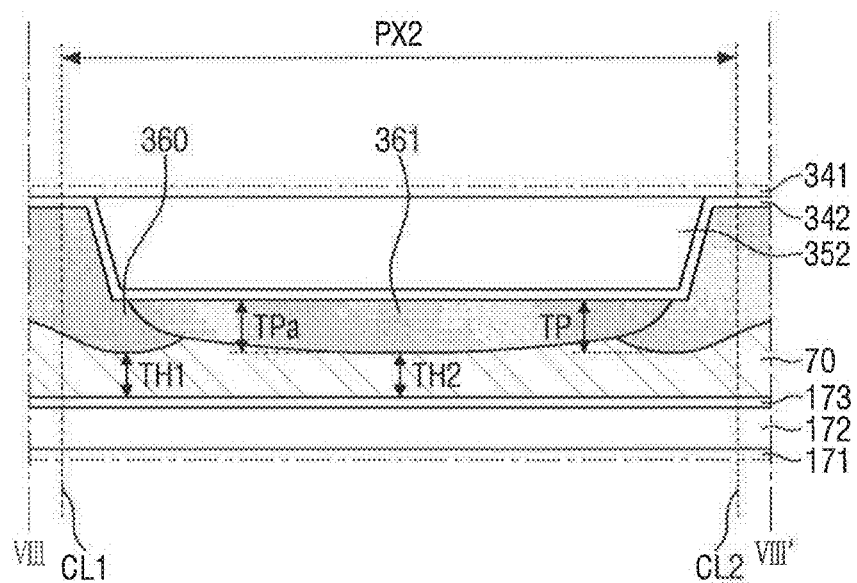
FIG. 16 is a cross-sectional view of the display device which is taken along line VIII-VIII' of FIG. 14 according to an exemplary embodiment of the present inventive concepts.

FIG. 14 is a plan view illustrating an arrangement of pixels, a second scattering pattern, and a first scattering pattern of a display device according to another exemplary embodiment. FIG. 15 is a cross-sectional view of a display device which is taken along line VII-VII' of FIG. 14 according to an exemplary embodiment. FIG. 16 is a cross-sectional view of the display device which is taken along line VIII-VIII' of FIG. 14 according to the exemplary embodiment.

Referring to FIGS. 14 to 16, a second scattering pattern 360_3 according to the present exemplary embodiment is different from the second scattering pattern 360 according to the exemplary embodiment in FIG. 2 in that the second scattering pattern 360_3 further includes a third scattering pattern 361 disposed at each of pixel row boundaries RL1 and RL2 between a first pixel row and a second pixel row.

When viewed from above, the third scattering pattern 361 is disposed between adjacent second scattering patterns 360 or between adjacent second scattering pattern 360 and first and second overlap portions 353b and 353c of the first second scattering pattern 353.

The third scattering pattern 361 may include substantially the same material as the second scattering pattern 360.

The third scattering pattern 361 may be disposed on a first light conversion pattern 351 and a second light conversion pattern 352. A planar width of the third scattering pattern 361 may be less than a planar width of the first and second light conversion patterns 351 and 352. The third scattering pattern 361 may be disposed on the first light conversion pattern 351 and the second light conversion pattern 352 extending in a column direction, and a surface of the third scattering pattern 361 may have a substantially curved shape.

Each of the third scattering patterns 361 may extend along each of the pixel column boundaries CL1 and CL2 and be in direct contact with, and connected to ends of adjacent second scattering patterns 360.

For example, each of the third scattering patterns 361 may be connected to the second scattering patterns 360 adjacent to both sides thereof or may be connected to the adjacent second scattering pattern and overlap portions of the first scattering pattern. Therefore, when viewed from above, the second scattering pattern 3603 may have a lattice shape in which the second scattering pattern 360 and the third scattering pattern 361 are integrally connected and are disposed along a pixel row boundary RL and a pixel column boundary CL.

The third scattering pattern 361 and the second scattering pattern 360 may have maximum protrusion thicknesses TPa and TP with respect to surfaces of the light conversion pattern 351 and 352, respectively.

The second scattering pattern 360_3 may be formed through a photolithography process. For example, a photosensitive organic film PR_2 may be formed on a second base substrate 310 on which the first and second light conversion patterns 351 and 352 are disposed. For example, the photosensitive organic film may be made of at least one organic material selected from among BCE, PI, PA, an acrylic resin, and a phenolic resin.

The photosensitive organic film PR_2 may include scattering particles. The scattering particles may be light scattering particles. A material of the scattering particles is not particularly limited. The material of the scattering particles may scatter at least a portion of transmitted light. For example, in an exemplary embodiment, the scattering particles may be metal oxide particles or organic particles. Examples of the metal oxide may include titanium oxide ($TiO_2$), zirconium oxide ($ZrO_2$), aluminum oxide ($Al_2O_3$), indium oxide ($In_2O_3$), zinc oxide (ZnO), tin oxide ($SnO_2$), and the like. Examples of a material of the organic particles may include an acrylic-based resin, a urethane-based resin, and the like.

As described above, a stepped portion may be formed between a region in which the light conversion patterns 351 and 352 are disposed and a region in which the light conversion patterns 351 and 352 are not disposed. A first scattering pattern material layer may be formed such that a surface height in the region in which the light conversion patterns 351 and 352 are disposed is greater than a surface height thereof in the region in which the light conversion patterns 351 and 352 are not disposed. The surface height of the first scattering pattern material layer forming the third scattering pattern 361 may be greater than the surface height of the first scattering pattern material layer forming the second scattering pattern 360. The first scattering pattern material layer disposed on the light conversion patterns 351 and 352 may be partially moved to an adjacent region (e.g., a region in which the light conversion patterns 351 and 352 are not disposed), and the surface height thereof may be decreased. However, the surface height of the first scattering pattern material layer disposed on the light conversion patterns 351 and 352 may still be greater than the surface height of the first scattering pattern material layer disposed in the region in which the light conversion patterns 351 and 352 are not disposed.

As described above, after an attachment process, in order to prevent damage due to contact and/or collision between the second scattering pattern 360_3 and a light-providing substrate 100, a filler 70 may maintain a minimum thickness between a surface of the second scattering pattern 360_3 and the light-providing substrate 100. When the surface height of the first scattering pattern material layer forming the third scattering pattern 361 becomes greater than the surface height of the first scattering pattern material layer forming the second scattering pattern 360, an overall thickness of the filler 70 may be increased so as to maintain a minimum thickness between the light-providing substrate 100 and a surface of the third scattering pattern 361, of which a surface height is greater than that of the second scattering pattern 360. This may cause degradation of a light-transmitting property of the display device 1_3.

In the present exemplary embodiment, surface heights of the second scattering pattern 360 and the third scattering pattern 361 may be adjusted to be the same as each other with respect to surfaces of the light conversion patterns 351 and 352 by using a light adjustment mask device M capable of adjusting a surface height of each region of the second scattering pattern 360_3. This will be described with reference to FIGS. 16 to 18.

Figure 17:
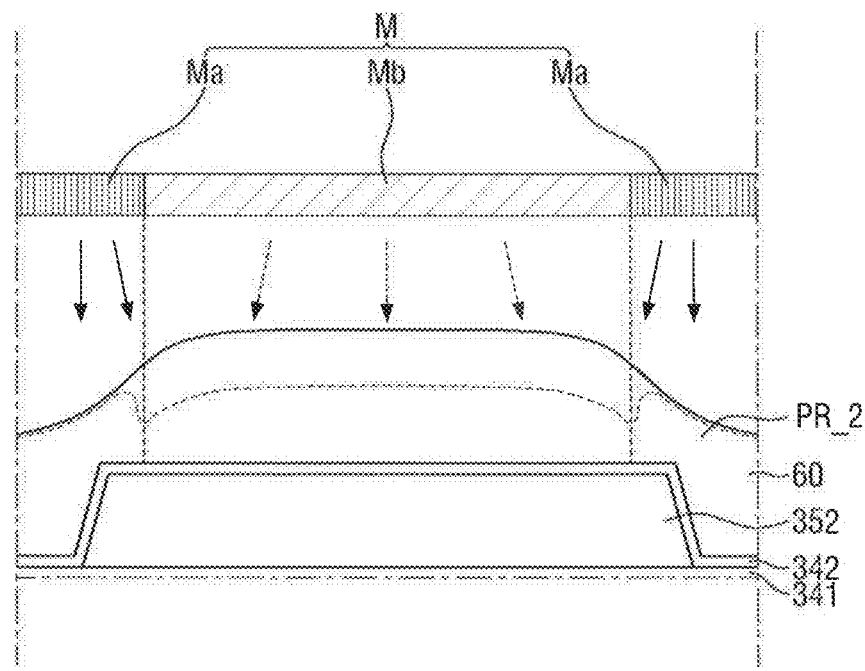
FIGS. 17 and 18 are cross-sectional views illustrating a method of forming a first scattering pattern according to an exemplary embodiment of the present inventive concepts.

FIGS. 16 and 17 are views illustrating a method of forming a first scattering pattern according to an exemplary embodiment.

Figure 18:
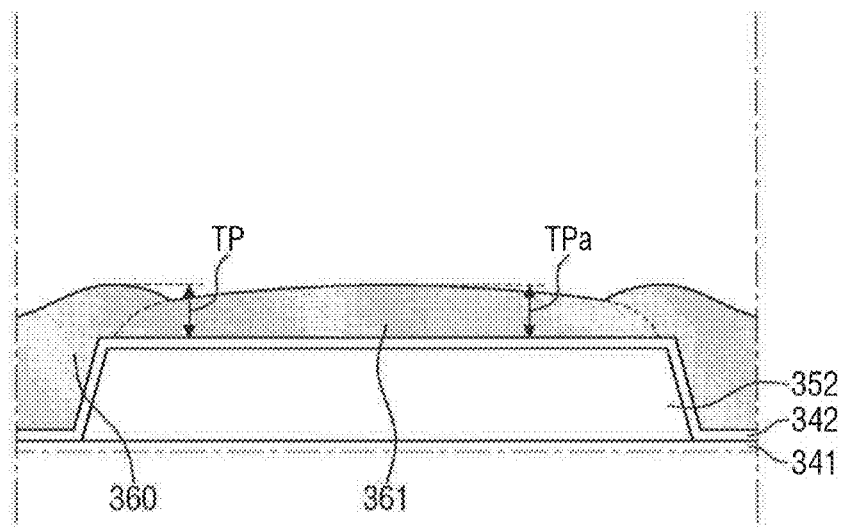

Referring to FIGS. 16 to 18, a second scattering pattern 360 according to the present exemplary embodiment may be formed using a light adjustment mask device M capable of controlling a thickness of each region. The light adjustment mask device M may be a HM or a slit mask. Hereinafter, an example in which the HM is applied will be mainly described.

Referring to FIG. 17, a light adjustment mask device M is disposed on a photosensitive organic film PR_2 in which a stepped portion is formed according to the presence or absence of light conversion patterns 351 and 352.

In an exemplary embodiment, the photosensitive organic film PR_2 may include a negative photosensitive material (negative PR). However, the present disclosure is not limited thereto, and the photosensitive organic film PR_2 may include a positive PR. Hereinafter, the photosensitive organic film PR_2 including the negative PR will be mainly described.

The light adjustment mask device M may include a first light transmitting portion Ma configured to transmit 100% of light, a second light transmitting portion Mb configured to transmit about half of light, and a third light transmitting portion Mc configured to hardly transmit light. In the case of the first light transmitting portion Ma and the second light transmitting portion Mb, as shown in FIG. 17, the second light transmitting portion Mb of the light adjustment mask device M may be disposed on the photosensitive organic film PR_2 disposed on the second light conversion pattern 352, and the first light transmitting portion Ma of the light adjustment mask device M may be disposed on the photosensitive organic film PR_2 on which the second light conversion pattern 352 is not disposed. However, when a positive PR is applied as the photosensitive organic film PR_2, positions of the second light transmitting portion Mb and the first light transmitting portion Ma may be modified.

Irradiation light, such as UV light or a CW laser, used in a normal patterning process may be irradiated from above the light adjustment mask apparatus N4.

In a region in which the first light transmitting portion Ma of the light adjustment mask device M is disposed, the irradiation light passes through the first light transmitting portion Ma intact and is irradiated onto the photosensitive organic film PR_2. In a region in which the second light transmitting portion Mb of the light adjustment mask device M is disposed, at least a portion of the irradiation light passes through the second light transmitting portion Mb and is irradiated onto the photosensitive organic film PR_2.

As a result, the photosensitive organic film PR_2 remains intact through development at a portion which is 100% exposed by the first light transmitting portion Ma, and thus, the portion which is 100% exposed takes a shape of a second scattering pattern 360. In addition, about half of the photosensitive organic film PR_2 remains in a region of the second light transmitting portion Mb, through which about half of light passes, and thus, a third scattering pattern 361 is formed.

Therefore, referring to FIGS. 16 to 18, as shown in FIG. 18, in a final structure, a difference between a protrusion height TP of the second scattering pattern 360 disposed below the first light transmitting portion Ma and a protrusion height TPa of the third scattering pattern 361 disposed below the second light transmitting portion Mb may be in a range of about 0.8 μm to about 1.2 μm. In terms of prevention of an increase in thickness of a filler 70, the protrusion heights IP and TPa of surfaces of the second scattering pattern 360 and the third scattering pattern 361 may be substantially the same as each other.

Thus, as shown in FIG. 16, the filler 70 has the same minimum thicknesses TH1 and TH2 in the regions in which the second scattering pattern 360 and the third scattering pattern 361 are disposed. Therefore, it is possible to prevent an increase in thickness of the filler 70 in a region in which the filler 70 overlaps the third scattering pattern 361, thereby preventing unnecessary decrease in a light-transmitting property.

Referring to FIGS. 14 and 15, the filler 70 may be formed on the second base substrate on which the third scattering pattern 361 is disposed. The filler 70 may be disposed on an entire surface of the second base substrate.

The second scattering pattern 360 disposed along pixel row boundaries RL1, RL2, and RL3 and pixel column boundaries CL1 and CL2 may function to guide a traveling direction in which the filler 70 flows. The second scattering pattern 360 may guide the traveling direction in which the filler 70 flows in a pixel column direction, and the third scattering pattern 361 may guide the traveling direction in which the filler 70 flows in a pixel row direction.

Therefore, the filler 70 may also travel in the pixel row direction to uniformly spread to the pixels PX1, PX2, and PX3. Accordingly, the third scattering pattern 361 may prevent non-filling of the filler 70.

Furthermore, like the second scattering pattern 360, the third scattering pattern 361 may maintain a gap between the light-providing substrate 100 and the light conversion substrate 300 in an attachment process of the light-providing substrate 100 and the light conversion substrate 300, thereby functioning to prevent the light-providing substrate 100 and the light conversion substrate 300 from being damaged due to contact and/or collision therebetween.

According to exemplary embodiments of the present disclosure, it is possible to provide a light conversion substrate capable of reducing color mixing, in which light emitted from a light-emitting element of a pixel travels to a light conversion pattern of a pixel adjacent thereto, and a display device.

According to exemplary embodiments of the present disclosure, it is possible to improve productivity by reducing the number of masks and process operations.

Effects of the present disclosure are not restricted to the exemplary embodiments set forth herein and more diverse effects are included in this description.

Although certain exemplary embodiments have been described herein, other embodiments and modifications will be apparent from this description. Accordingly, the present inventive concepts are not limited to the exemplary embodiments,

What is claimed is:

1. A light conversion substrate comprising:
   a first substrate which comprises a first region, a second region, and a third region;
   a first light conversion pattern disposed on the first region and including first wavelength conversion particles;
   a first color filter disposed between the first substrate and the first light conversion pattern, the first color filter overlapping the first light conversion pattern and including a first colorant;
   a second light conversion pattern disposed on the second region and is spaced apart from the first light conversion pattern, the second light conversion pattern including second wavelength conversion particles;
   a second color filter disposed between the first substrate and the second light conversion pattern, the second color filter overlapping the second light conversion pattern and including a second colorant which is different from the first colorant; and
   a first scattering pattern disposed on the third region and is configured to fill a space between the first light conversion pattern and the second light conversion pattern, the first scattering pattern including first scattering particles,
   wherein the first scattering pattern overlaps a portion of the first light conversion pattern and a portion of the second light conversion pattern in a direction of a thickness of the first substrate,
   wherein the first light conversion pattern and the second light conversion pattern comprise the same scattering particles as the first scattering pattern, and
   wherein the first scattering pattern overlaps the first color filter and the second color filter.

2. The light conversion substrate of claim 1, wherein the first scattering pattern comprises a flat portion, a first overlap portion that extends from one lateral side of the flat portion and overlaps the second light conversion pattern in the direction of the thickness of the first substrate, and a second overlap portion which extends from the other lateral side of the flat portion and overlaps the first light conversion pattern in the direction of the thickness of the first substrate.

3. The light conversion substrate of claim 1, further comprising a capping layer that is disposed on the first light conversion pattern and the second light conversion pattern and between the first substrate and the first scattering pattern.

4. The light conversion substrate of claim 1,
   wherein the first substrate further comprises a fourth region,
   wherein the second region is disposed between the fourth region and the third region,
   wherein the third region is disposed between the first region and the second region,
   wherein the light conversion substrate further comprises
   a third light conversion pattern disposed on the fourth region and including the first wavelength conversion particles; and
   a second scattering pattern disposed between the fourth region and the second region, and
   wherein the second scattering pattern is configured to fill a space between the third light conversion pattern and the second light conversion pattern and overlaps a portion of the third light conversion pattern and a portion of the second light conversion pattern.

5. The light conversion substrate of claim 4, wherein the first light conversion pattern, the second light conversion pattern, and the first scattering pattern have a stripe form which extends in a column direction when viewed from above.

6. The light conversion substrate of claim 4, wherein the first scattering pattern and the second scattering pattern comprise the same scattering particles.

7. The light conversion substrate of claim 1, wherein a size of the first wavelength conversion particles is greater than a size of the second wavelength conversion particles.

8. The light conversion substrate of claim 5, wherein the first region, the second region, and the third region comprise a plurality of pixels in the column direction and a row direction intersecting with the column direction and comprise a third scattering pattern disposed on the first light conversion pattern and the second light conversion pattern along a row boundary between the pixels and is disposed between a first overlap portion and the second scattering pattern and between a second overlap portion and the second scattering pattern.

9. The light conversion substrate of claim 8, wherein a thickness of the first overlap portion, a thickness of the second overlap portion, a thickness of the second scattering pattern, and a thickness of the third scattering pattern are the same.

10. A light conversion substrate comprising:
a first substrate which comprises a first region, a second region, and a third region;
a first light conversion pattern disposed on the first region and including first wavelength conversion particles;
a second light conversion pattern disposed on the second region and is spaced apart from the first light conversion pattern, the second light conversion pattern including second wavelength conversion particles; and
a first scattering pattern disposed on the third region and is configured to fill a space between the first light conversion pattern and the second light conversion pattern, the first scattering pattern including first scattering particles,
wherein the first scattering pattern overlaps a portion of the first light conversion pattern and a portion of the second light conversion pattern in a direction of a thickness of the first substrate,
wherein the first scattering pattern comprises a flat portion, a first overlap portion that extends from one lateral side of the flat portion and overlaps the second light conversion pattern in the direction of the thickness of the first substrate, and a second overlap portion which extends from the other lateral side of the flat portion and overlaps the first light conversion pattern in the direction of the thickness of the first substrate, and
wherein protruding thicknesses that the first overlap portion and the second overlap portion protrude from a surface of the first light conversion pattern and the second light conversion pattern are greater than a thickness of the flat portion.

11. A light conversion substrate comprising:
a first substrate which comprises a first region, a second region, and a third region;
a first light conversion pattern disposed on the first region and including first wavelength conversion particles;
a second light conversion pattern disposed on the second region and is spaced apart from the first light conversion pattern, the second light conversion pattern including second wavelength conversion particles; and
a first scattering pattern disposed on the third region and is configured to fill a space between the first light conversion pattern and the second light conversion pattern, the first scattering pattern including first scattering particles,
wherein the first scattering pattern overlaps a portion of the first light conversion pattern and a portion of the second light conversion pattern in a direction of a thickness of the first substrate,
wherein the first substrate further comprises a fourth region,
wherein the second region is disposed between the fourth region and the third region,
wherein the third region is disposed between the first region and the second region,
wherein the light conversion substrate further comprises:
a third light conversion pattern disposed on the fourth region and including the first wavelength conversion particles; and
a second scattering pattern disposed between the fourth region and the second region;
wherein the second scattering pattern is configured to fill the space between the third light conversion pattern and the second light conversion pattern and overlaps a portion of the third light conversion pattern and a portion of the second light conversion pattern, and
wherein a maximum thickness of the second scattering pattern in the direction of the first substrate is greater than a maximum thickness of the third light conversion pattern and a maximum thickness of the second light conversion pattern in the direction of the first substrate.

12. A display device comprising a light-conversion substrate and a light-providing substrate that face each other, the light-conversion substrate and light-providing substrate including a first pixel region and a second pixel region,
wherein the light conversion substrate comprises:
a first substrate,
a first light conversion pattern disposed in the first pixel region and includes first wavelength conversion particles,
a first color filter disposed between the first substrate and the first light conversion pattern, the first color filter overlapping the first light conversion pattern and including a first colorant;
a second light conversion pattern disposed in the second pixel region and is spaced apart from the first light conversion pattern, the second light conversion pattern including second wavelength conversion particles,
a second color filter disposed between the first substrate and the second light conversion pattern, the second color filter overlapping the second light conversion pattern and including a second colorant which is different from the first colorant; and
a first scattering pattern disposed to fill a space between the first light conversion pattern and the second light conversion pattern, the first scattering pattern including scattering particles,
wherein the light-providing substrate comprises a first emission region overlapping the first light conversion pattern, a second emission region overlapping the second light conversion pattern, and a third emission region overlapping the first scattering pattern, and
wherein the first scattering pattern overlaps a portion of the first light conversion pattern and a portion of the second light conversion pattern in a direction of a thickness of the first substrate, and
wherein the first light conversion pattern and the second light conversion pattern comprise the same scattering particles as the first scattering pattern, and
wherein the first scattering pattern overlaps the first color filter and the second color filter.

13. The display device of claim 12,
wherein the light-conversion substrate and light-providing substrate further comprise a third pixel region,
wherein the second pixel region is disposed between the first pixel region and the third region,
wherein the light conversion substrate further comprises:
a third light conversion pattern disposed in the third region and including the first wavelength conversion particles;
a second scattering pattern disposed between the third pixel region and the second pixel region and configured to fill a space between the third light conversion pattern and the second light conversion pattern, the second scattering pattern overlapping a portion of the third light conversion pattern and a portion of the second light conversion pattern in the direction of the thickness of the first substrate.

14. The display device of claim 13, wherein the first scattering pattern and the second scattering pattern comprise the same scattering particles.

15. The display device of claim 12, wherein the first emission region, the second emission region, and the third emission region are configured to emit a first color light,
the first light conversion pattern is configured to convert the first color light into a second color light and output the second color light, and
the second light conversion pattern is configured to convert the first color light into a third color light and output the third color light.

16. The display device of claim 12, further comprising a filler which is disposed between the light conversion substrate and the light-providing substrate.

* * * * *